(12) United States Patent
Chadha et al.

(10) Patent No.: US 12,424,481 B2
(45) Date of Patent: Sep. 23, 2025

(54) MODULAR SUBSTRATE SUPPORT ASSEMBLY

(71) Applicant: Applied Materials, Inc., Santa Clara, CA (US)

(72) Inventors: Arvinder Manmohan Singh Chadha, San Jose, CA (US); Vijay D. Parkhe, San Jose, CA (US); Glen T Mori, Gilroy, CA (US); Christopher Laurent Beaudry, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/583,664

(22) Filed: Feb. 21, 2024

(65) Prior Publication Data
US 2025/0105051 A1    Mar. 27, 2025

Related U.S. Application Data

(60) Provisional application No. 63/540,001, filed on Sep. 22, 2023.

(51) Int. Cl.
| H01L 21/68 | (2006.01) |
| H01L 21/67 | (2006.01) |
| H01L 21/683 | (2006.01) |
| H01L 21/687 | (2006.01) |

(52) U.S. Cl.
CPC .. *H01L 21/68785* (2013.01); *H01L 21/67103* (2013.01); *H01L 21/67248* (2013.01); *H01L 21/6833* (2013.01); *H01L 21/68757* (2013.01)

(58) Field of Classification Search
CPC ......... H01L 21/68785; H01L 21/68757; H01L 21/6833; H01L 21/67248; H01L 21/67103
See application file for complete search history.

(56) References Cited

U.S. PATENT DOCUMENTS

| 10,861,682 B2 * | 12/2020 | O'Banion | ......... H01L 21/67109 |
| 2019/0006157 A1 * | 1/2019 | O'Banion | ......... H01L 21/67109 |
| 2021/0074569 A1 * | 3/2021 | Margavio | ............ H01L 21/6831 |
| 2021/0159098 A1 * | 5/2021 | Parkhe | ............. H01J 37/32477 |
| 2023/0125679 A1 * | 4/2023 | Takebayashi | ....... H01L 21/6833 |
| | | | 361/234 |

FOREIGN PATENT DOCUMENTS

KR    20210112177 A    *    9/2021

OTHER PUBLICATIONS

Shon Wook Chul et al.; KR20210112177A; Recover method of electrostatic chuck assembly; EPO English Machine Translation; Sep. 14, 2021; pp. 1-10 (Year: 2021).*
International Search Report and Written Opinion for International Application No. PCT/US2024/047841, mailed Dec. 23, 2024, 10 Pages.

* cited by examiner

*Primary Examiner* — Bayan Salone
(74) *Attorney, Agent, or Firm* — Lowenstein Sandler LLP

(57) ABSTRACT

An electrostatic chuck assembly includes a first puck plate including one or more first functional elements, a second puck plate including one or more second functional elements, and an interface layer at least partially bonding the first puck plate and the second puck plate.

15 Claims, 12 Drawing Sheets

MODULAR SUBSTRATE SUPPORT ASSEMBLY

CROSS REFERENCE TO RELATED APPLICATIONS

This application claims priority of U.S. Provisional Patent Application No. 63/540,001, titled "Modular Substrate Support Assembly" filed on Sep. 22, 2023, the entire contents of which is incorporated herein by reference.

TECHNICAL FIELD

Some embodiments of the present disclosure relate, in general, to a modular substrate support assembly having multiple discs.

BACKGROUND

Electrostatic chucks and heaters are widely used to hold substrates, such as semiconductor wafers, during substrate processing in processing chambers. Electrostatic chucks typically include one or more electrodes embedded within a unitary chuck body which includes a dielectric or semi-conductive ceramic material across which an electrostatic clamping field can be generated to chuck a substrate. Heaters generally include heating elements to heat a supported substrate.

Electrostatic chucks and heaters are traditionally formed from a single, monolithic, ceramic body that includes all of the functional elements of the electrostatic chuck or heater embedded within the single ceramic body. As a result, if any functional component of the electrostatic chuck or heater fails, the entire electrostatic chuck or heater is replaced. Additionally, due to the multiple functional elements embedded in the electrostatic chuck or heater, there is an increased risk of the electrostatic chuck or heater cracking during manufacture and/or use. The complexity of the electrostatic chuck or heater is also limited to minimize chances of cracking and to ensure manufacturability of the electrostatic chuck or heater.

SUMMARY

Some embodiments of the present disclosure described herein cover a substrate support assembly having a first puck plate including one or more first functional elements, a second puck plate including one or more second functional elements, and an interface layer at least partially bonding the first puck plate and the second puck plate.

Some embodiments of the present disclosure described herein cover a method for evaluating and/or adjusting a thermal response of a substrate support assembly. The method includes measuring a thermal response of one or more operating temperatures of a first substrate support assembly including a first puck plate assembly coupled to a cooling plate. The method further includes determining whether the thermal response for the first substrate support assembly satisfies one or more thermal response criteria. The method may include adjusting or replacing one or more puck plates of the first puck plate assembly to modify the thermal response of the first substrate support assembly responsive to determining that the thermal response fails to satisfy the one or more thermal response criteria.

Some embodiments of the present disclosure described herein cover a method for evaluating thermal response of a puck plate assembly. The method may include determining thermal properties of one or more puck plates of the puck plate assembly. The method further includes, determining, based on the thermal properties of the one or more puck plates, one or more adjustments to be made to at least one puck plate. The method may further include performing the one or more adjustments to the at least one puck plate and assembling the puck plate assembly with the modified puck plate, or one or more new puck plates.

Some embodiments of the present disclosure described herein cover a substrate support assembly. The substrate support assembly comprises a body comprising one or more puck plates, a first heating electrode in a first heating zone of the body, and a second heating electrode in the first heating zone of the body. The first heating electrode and the second heating electrode are connected in series or in parallel. A series connection between the first heating electrode and the second heating electrode increases a net resistance for a combination of the first heating electrode and the second heating electrode, and a parallel connection between the first heating electrode and the second heating electrode reduces a net resistance for the combination of the first heating electrode and the second heating electrode.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Figure 1:
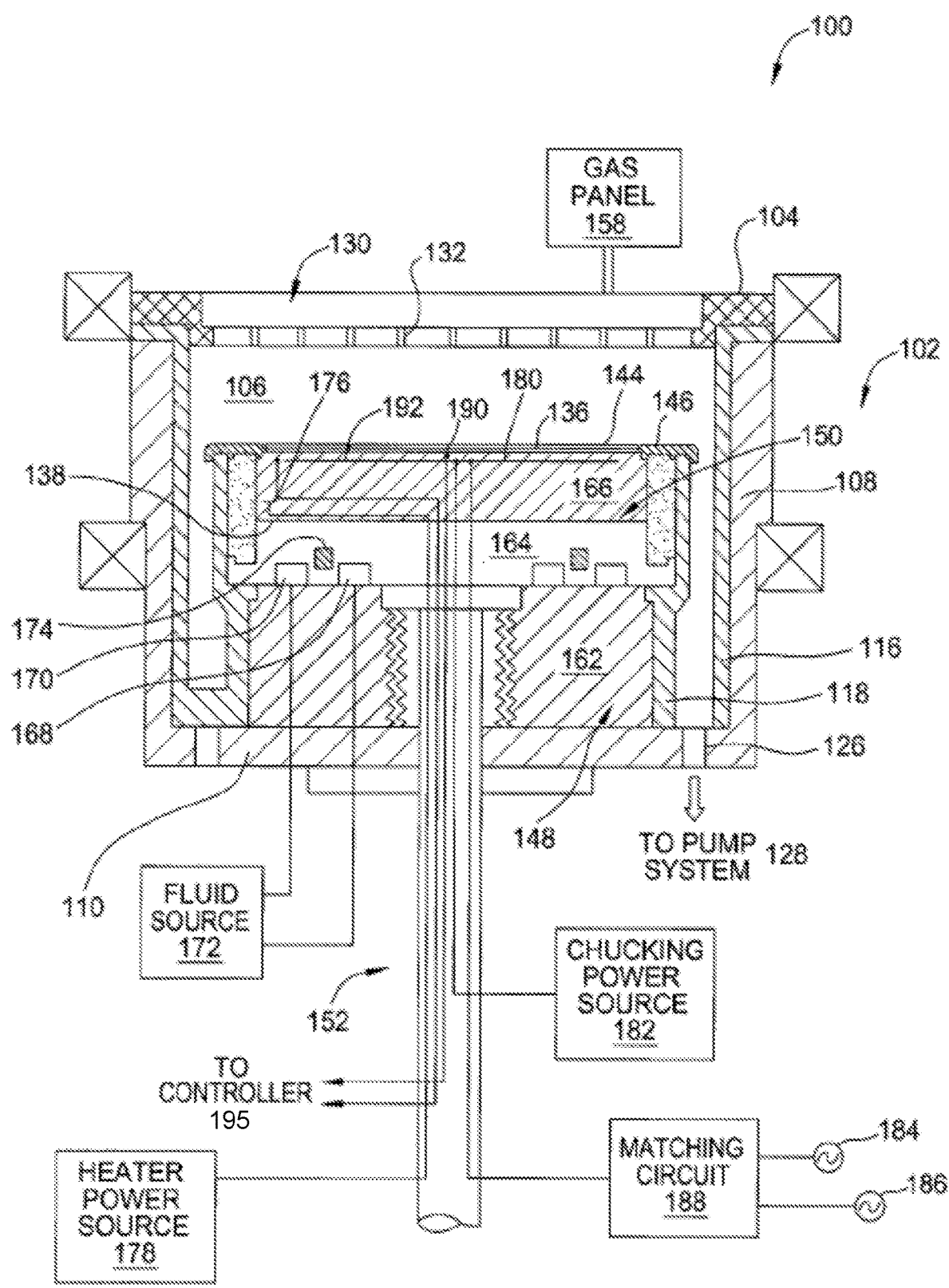
FIG. 1 depicts a sectional side view of one embodiment of a processing chamber.

Embodiments of the present disclosure provide an architecture for building substrate support assemblies (e.g., puck assemblies of substrate support assemblies) from a combination of plates, where each plate includes one or more functional elements. A library of plates may be maintained, and a substrate support such as a heater (e.g., a deposition heater), an electrostatic chuck, a vacuum chuck, a chiller, etc. may be designed by combining plates from the library of plates. Additionally, new plates may be designed and added to the library at any time to increase options for assembling plate assemblies that function as a substrate support. Individual plates having different functional elements may be selected and stacked, and may be bonded together using one or more interface layers. Embodiments enable new substrate supports to be quickly and easily designed. Additionally, because multiple plates are used in embodiments, the fully or partially assembled substrate support assembly may be tested for thermal performance, and one or more plates may be adjusted (e.g., planed or polished) to adjust a thermal response of the individual plates and/or of the substrate support assembly as a whole. Accordingly, thermal response of the substrate support assembly may be further tailored, enabling fine control of the thermal response for the substrate support assembly.

In one embodiment, a substrate support assembly includes two or more puck plates, which may be bonded using a bonding layer (also referred to as an interface layer) and/or a mechanical clamp. One or more puck plates may include one or more functional elements, such as a clamp electrode, a heating element, a zone heater, a pixelated heater, a radio frequency (RF) electrode, a RF filter, a gas channel, a gas pocket, a cooling channel, or combinations thereof. In one embodiment, a top puck plate may include a clamp electrode and an RF electrode. An intermediate puck plate may include one or more heating elements, such as for a zone heater and/or a pixelated heater. Another puck plate may include a RF filter to ensure that interference and noise are minimized, which may reduce any potential impact on the substrate. Another puck plate may serve as a wire connection layer including wires that connect to one or more of the functional elements using vias, and that further connect to a power source and/or to ground. A bottom puck plate may include one or more cooling loops or channels to circulate a cooling fluid (e.g., a coolant or a refrigerant or gas) and absorb the heat from the puck plates above the bottom puck plate. Two or more puck plates can be bonded using a bonding layer including a melting point depressing layer (MDL), which may be applied to a bottom surface of a top puck plate and/or a top surface of a bottom puck plate. The MDL layer may include, for example, Ni, Ti, C and/or Si. The bonding layer may also include a metal interlayer, such as a flexible graphite layer, an organic elastomer, Al, In, Ni, Ti, and/or an alloy including Ni—Ti or Mo—Mg, or Cu—Ag or Al alloy.

Additionally, the two or more puck plates can be mechanically bonded such that a bottom surface of the first puck plate may include a male mating component and a top surface of the second puck plate may include a female mating component that connects to the male mating component. In some embodiments, a top surface of the second puck plate may include a male mating component, and a bottom surface of the first puck plate may include a female mating component. The male mating component may include a protrusion along a circumference of the first puck plate, and the female mating component may include a groove along a circumference of the second puck plate. Alternatively, or additionally, the male mating component may include one or more protrusions, and the female mating component may include one or more indents that mate with the one or more protrusions. Examples of materials that may be used in forming the two or more puck plates include niobium, aluminum oxide, aluminum nitride, single crystal alumina, or sapphire. One or more puck plates may be formed using a hot press, a hot isostatic press, a green sheet, a gel cast, or a sol gel process, for example.

Embodiments of the present disclosure also provide a method for evaluating thermal response of a substrate support assembly and modifying one or more plates forming the electrostatic assembly so as to improve its performance. A substrate support assembly may be fully or partially assembled, and then thermally tested to measure a thermal response. Additionally, or alternatively, individual plates to be used in the substrate support assembly may be thermally tested to measure a thermal response. A design of the substrate support assembly may be modified responsive to the testing. Additionally, or alternatively, one or more plates may be altered, such as by polishing or planing the one or more plates to adjust a thermal response of the one or more plates, and therefore of the substrate support assembly as a whole.

Embodiments of the present disclosure further include techniques for adjusting a thermal performance of heating elements of a substrate support assembly by arranging the heating elements in parallel and/or in series. An aggregate resistance of a set of heating elements may be increased by arranging the heating elements in the set, in series. Similarly, the aggregate resistance of the set of heating elements may be reduced by arranging the heating elements in the set in parallel. The heating elements that are arranged in series and/or parallel may be positioned at a same level or pitch within a plate, at different levels or pitches within a same plate, and/or within different plates.

FIG. 1 is a sectional view of one embodiment of a processing chamber 100 having a substrate support assembly 150 disposed therein. The processing chamber 100 may be any type of processing chamber, such as a deposition chamber, an etch chamber, an oxidation chamber, an implant chamber, and so on. While the substrate support assembly 150 is described as being an electrostatic chuck assembly or a heater assembly in some embodiments, the substrate support assembly may be replaced with other types of substrate support assemblies, such as a vacuum chuck assembly, a deposition heater assembly, and so on. In one embodiment, the substrate support assembly 150 includes a puck assembly 166 having an upper puck plate bonded to a lower puck plate, as will be discussed in greater detail below. The substrate support assembly 150 may additionally include more than two plates, where each plate may include zero or more different functional elements of the substrate support assembly (e.g., chucking electrodes, radiofrequency (RF) electrodes, main heating electrodes, auxiliary heating electrodes, cooling channels, and so on). The puck assembly 166 can be coupled to a cooling plate by multiple fasteners, as discussed in greater detail below. The puck assembly 166 can also be bonded to the cooling plate by a bond such as a metal bond, an organic bond, a polymer bond, etc.

The processing chamber 100 includes a chamber body 102 and a lid 104 that enclose an interior volume 106. The chamber body 102 may be fabricated from aluminum, stainless steel, or other suitable material. The chamber body 102 generally includes sidewalls 108 and a bottom 110. An outer liner 116 may be disposed adjacent the side walls 108 to protect the chamber body 102. The outer liner 116 may be fabricated and/or coated with a plasma or halogen-containing gas resistant material. In one embodiment, the outer liner 116 is fabricated from aluminum oxide. In another embodiment, the outer liner 116 is fabricated from or coated with yttria, yttrium alloy, or an oxide thereof.

An exhaust port 126 may be defined in the chamber body 102 and may couple the interior volume 106 to a pump system 128. The pump system 128 may include one or more pumps and throttle valves utilized to evacuate and regulate the pressure of the interior volume 106 of the processing chamber 100.

The lid 104 may be supported on the sidewall 108 of the chamber body 102. The lid 104 may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through a gas distribution assembly 130 or nozzle that may be part of the lid 104. Examples of processing gases may be used to process in the processing chamber including halogen-containing gas, such as $C_2F_6$, $SF_6$, $SiCl_4$, HBr, $NF_3$, $CF_4$, $CHF_3$, $CH_2F_3$, $Cl_2$ and $SiF_4$, among others, and other gases such as $O_2$, or $N_2O$. Examples of carrier gases include $N_2$, He, Ar, and other gases inert to process gases (e.g., non-reactive gases). The gas distribution assembly 130 may have multiple apertures 132 on the downstream surface of the gas distribution assembly 130 to direct the gas flow to the surface of the substrate 144. Additionally, or alternatively, the gas distribution assembly 130 can have a center hole where gases are fed through a ceramic gas nozzle. The gas distribution assembly 130 may be fabricated and/or coated by a ceramic material, such as silicon carbide, Yttrium oxide, etc. to provide resistance to halogen-containing chemistries to prevent the gas distribution assembly 130 from corrosion.

In embodiments, the substrate support assembly 150 is disposed in the interior volume 106 of the processing chamber 100 below the gas distribution assembly 130. The substrate support assembly 150 holds a substrate 144 during processing. An inner liner 118 may be coated on the periphery of the substrate support assembly 150. The inner liner 118 may be a halogen-containing gas resist material such as those discussed with reference to the outer liner 116. In one embodiment, the inner liner 118 may be fabricated from the same materials of the outer liner 116.

In one embodiment, the substrate support assembly 150 is part of a greater assembly 148 that includes the substrate support assembly 150 as well as a mounting plate 162 supporting a pedestal 152. In one embodiment, the substrate support assembly 150 further includes a thermally conductive base referred to herein as a cooling plate 164 coupled to a puck assembly (also referred to as a puck plate assembly) 166. The cooling plate 164 may be coupled to the puck assembly 166 by multiple fasteners and/or by a bonding layer. The substrate support assembly 150 described in embodiments may be used for Johnsen-Rahbek and/or Coulombic electrostatic chucking in embodiments. The substrate support assembly 150 may additionally or alternatively be used as a heater, such as a deposition heater that is configured to heat a support substrate 144 during a deposition process.

In one embodiment, a protective ring 146 is disposed over a portion of the puck assembly 166 at an outer perimeter of the puck assembly 166. In one embodiment, the puck assembly 166 (or one or more plates of the puck assembly 166) is coated with a protective layer 136. Alternatively, the puck assembly 166 may not be coated by a protective layer 136. The protective layer 136 may be a ceramic such as $Y_2O_3$ (yttria or yttrium oxide), $Y_4Al_2O_9$ (YAM), $Al_2O_3$ (alumina), $Y_3Al_5O_{12}$ (YAG), $YAlO_3$ (YAP), Quartz, SiC (silicon carbide), $Si_3N_4$ (silicon nitride) Sialon, AlN (aluminum nitride), AlON (aluminum oxynitride), $TiO_2$ (titania), $ZrO_2$ (zirconia), TiC (titanium carbide), ZrC (zirconium carbide), TiN (titanium nitride), TiCN (titanium carbon nitride), $Y_2O_3$ stabilized $ZrO_2$ (YSZ), and so on. The protective layer may also be a ceramic composite such as $Y_3Al_5O_{12}$ distributed in $Al_2O_3$ matrix, $Y_2O_3$—$ZrO_2$ solid solution or a SiC—$Si_3N_4$ solid solution. The protective layer may also be a ceramic composite that includes a yttrium oxide (also known as yttria and $Y_2O_3$) containing solid solution. For example, the protective layer may be a ceramic composite that is composed of a compound $Y_4Al_2O_9$ (YAM) and a solid solution $Y_{2-x}Zr_xO_3$ ($Y_2O_3$—$ZrO_2$ solid solution). Note that pure yttrium oxide as well as yttrium oxide containing solid solutions may be doped with one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides. Also note that pure Aluminum Nitride as well as doped Aluminum Nitride with one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides may be used. Alternatively, the protective layer may be sapphire or MgAlON.

In embodiments, the puck assembly 166 includes an upper puck plate (not shown) and a lower puck plate (not shown) bonded by a metal and/or organic bond. The puck assembly 166 may also include more than two plates. The upper puck plate and/or one or more other plates may be formed from a monolithic dielectric or electrically insulative material (e.g., having an electrical resistivity of greater than 1014 Ohm meter) that is usable for semiconductor processes at temperatures of 150° C. and above. In one embodiment, the upper puck plate and/or other plate(s) is composed of materials usable from about 20° C. to about 500° C. In one embodiment, the upper puck plate and/or other plate(s) is AlN or another ceramic. The AlN upper puck plate and/or other plate(s) may be undoped or may be doped. For example, the AlN may be doped with Samarium oxide ($Sm_2O_3$), Cerium oxide ($CeO_2$), Titanium dioxide ($TiO_2$), or a transition metal oxide. In one embodiment, the upper puck plate and/or other plate(s) is $Al_2O_3$. The $Al_2O_3$ upper puck plate and/or other plate(s) may be undoped or may be doped. For example, the $Al_2O_3$ may be doped with Titanium dioxide ($TiO_2$) or a transition metal oxide. In some embodiments, each of the plates of the puck assembly 166 may be formed of a same ceramic. In other embodiments, different plates of the puck assembly 166 may be formed of different ceramics.

The lower puck plate and/or one or more other plates may have a coefficient of thermal expansion that is matched or close to a coefficient of thermal expansion of the upper puck plate. In one embodiment, the lower puck plate and/or other plate(s) is a SiC porous body that is infiltrated with an AlSi alloy (referred to as AlSiSiC). The lower puck plate and/or other plate(s) may alternatively be AlN or $Al_2O_3$ or other ceramic material or a combination thereof (e.g., aluminum oxynitride (ALON)). In one embodiment, the lower puck plate and/or other plate(s) is undoped AlN or undoped $Al_2O_3$. In one embodiment, the lower puck plate and/or other plate(s) is composed of the same material as the upper puck plate. The AlSiSiC material, AlN or $Al_2O_3$ may be used, for example, in reactive etch environments or in inert environments.

In one embodiment, the lower puck plate and/or other plate(s) is Molybdenum. Molybdenum may be used, for example, if the puck assembly 166 is to be used in an inert environment. Examples of inert environments include environments in which inert gases such as Ar, O2, N, etc. are flowed. Molybdenum may be used, for example, if the puck assembly 166 is to chuck a substrate for metal deposition.

Molybdenum may also be used for the lower puck plate and/or other plate(s) for applications in a corrosive environment (e.g., etch applications). In such an embodiment, exposed surfaces of the lower puck plate and/or other plate(s) may be coated with a plasma resistant coating after the lower puck plate is bonded to the upper puck plate. The plasma coating may be performed via a plasma spray process. The plasma resistant coating may cover, for example, side walls of the lower puck plate and an exposed horizontal step of the lower puck plate. In one embodiment, the plasma resistant coating is $Al_2O_3$. Alternatively, the plasma resistant coating may be $Y_2O_3$ or a $Y_2O_3$ containing oxide. Alternatively, the plasma resistant coating may be any of the materials described with reference to protective layer 136.

The mounting plate 162 is coupled to the bottom 110 of the chamber body 102 and includes passages for routing utilities (e.g., fluids, power lines, sensor leads, etc.) to the cooling plate 164 and the puck assembly 166. The cooling plate 164 and/or puck assembly 166 may include one or more optional embedded heating elements 176, optional embedded thermal isolators 174 optional conduits 168, 170 to control a lateral temperature profile of the substrate support assembly 148, and/or other functional elements. In embodiments, different functions of the puck assembly 166 may be divided across multiple plates. For example, one plate may include RF electrodes, one plate may include primary heating electrodes, one plate may include auxiliary heating electrodes, and so on. In some embodiments, multiple functions are provided by a single plate. For example, one plate of puck assembly 166 may include both RF electrodes and chucking electrodes. In one embodiment, a thermal gasket 138 and/or o-ring is disposed on at least a portion of the cooling plate 164.

The conduits 168, 170 may be fluidly coupled to a fluid source 172 that circulates a temperature regulating fluid through the conduits 168, 170. The embedded thermal isolators 174 may be disposed between the conduits 168, 170 in one embodiment. The embedded heating elements 176 are regulated by a heater power source 178. The embedded heating elements 176 may be included in one plate of puck assembly 166. The conduits 168, 170 and embedded heating elements 176 may be utilized to control the temperature of the puck assembly 166, which may heat and/or cool the puck assembly 166 and a substrate (e.g., a wafer) being processed. In one embodiment, the puck assembly 166 includes two separate heating zones that can maintain distinct temperatures. In another embodiment, the puck assembly 166 includes four different heating zones that can maintain distinct temperatures. In other embodiments, the puck assembly 166 includes more than four heating zones (e.g., 8, 16, 32, 64, 128, 216, etc. pixelate heating zones). The temperature of the puck assembly 166 and the thermally conductive base 164 may be monitored using multiple temperature sensors 190, 192, which may be monitored using a controller 195. The temperature sensors 190, 192 may be included in one plate of puck assembly 166 and/or in multiple plates of the puck assembly 166, which may be a same plate or plates or different plate or plates from the plate(s) containing the heating elements 176.

The puck assembly 166 may further include multiple gas passages such as grooves, mesas and other surface features that may be formed in an upper surface of a topmost plate of the puck assembly 166. The gas passages may be fluidly coupled to a source of a heat transfer (or backside) gas, such as He via holes drilled in the plates of the puck assembly 166. In operation, the backside gas may be provided at controlled pressure into the gas passages to enhance the heat transfer between the puck assembly 166 and the substrate 144.

In one embodiment, the puck assembly 166 includes at least one clamping electrode 180 controlled by a chucking power source 182. The clamping electrode 180 may be included in one plate of puck assembly 166. The clamping electrode 180 (also referred to as a chucking electrode) may further be coupled to one or more RF power sources 184, 186 through a matching circuit 188 for maintaining a plasma formed from process and/or other gases within the processing chamber 100. In one embodiment, a different RF electrode or set of electrodes are connected to one or more RF power sources 184, 186 and used for maintaining a plasma. The RF electrode(s) may be included in one plate of puck assembly 166. The one or more RF power sources 184, 186 may be capable of producing an RF signal having a frequency from about 50 kHz to about 3 GHz and a power of up to about 10,000 Watts. In one embodiment, an RF signal is applied to the metal base, an alternating current (AC) is applied to the heater and a direct current (DC) is applied to the clamping electrode 180.

Figure 2:
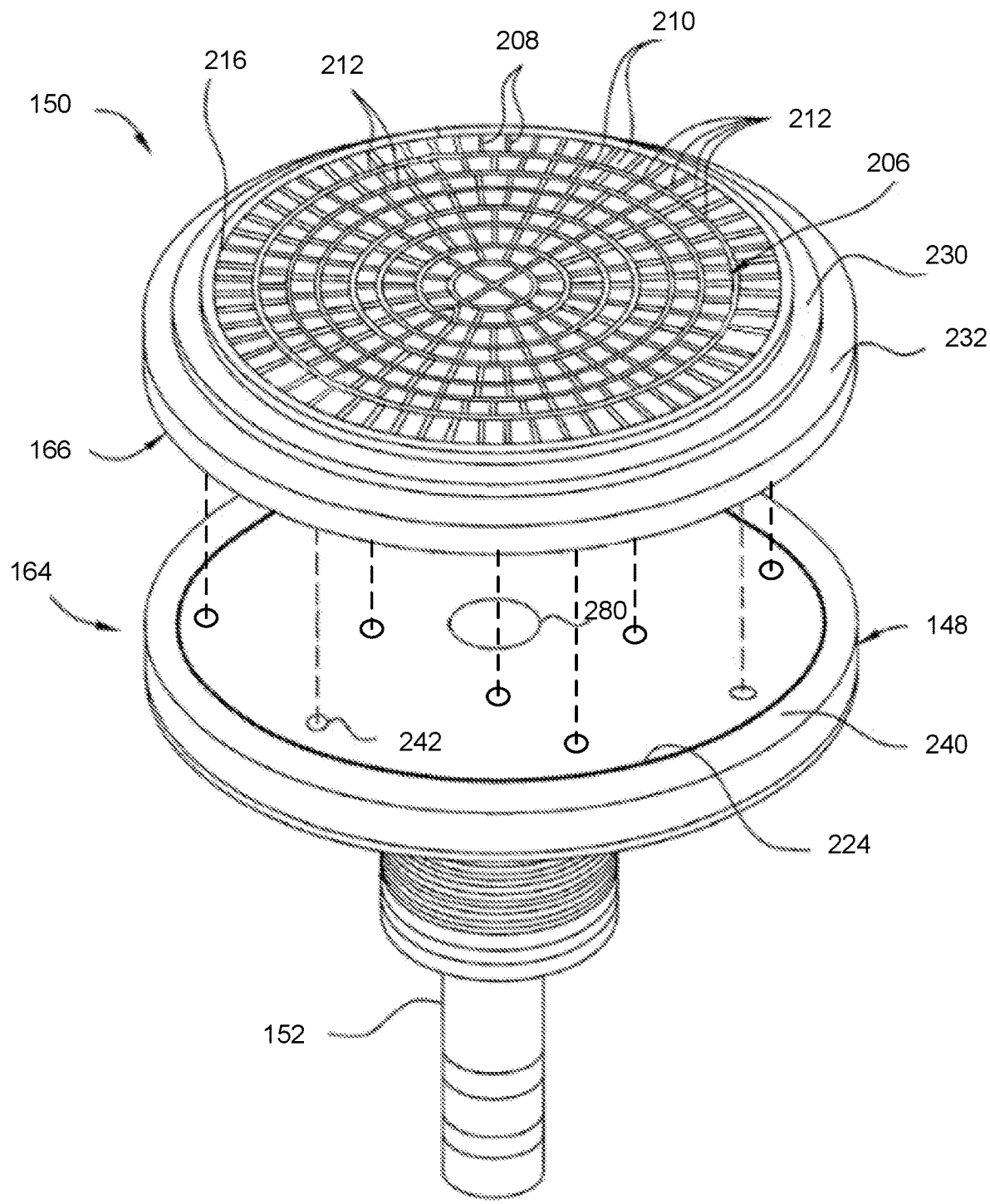
FIG. 2 depicts an exploded view of one embodiment of a substrate support assembly.

FIG. 2 depicts an exploded view of one embodiment of the assembly 148. The assembly 148 depicts an exploded view of the substrate support assembly 150 including the puck assembly 166 and the pedestal 152. The substrate support assembly 150 includes the puck assembly 166, as well as the cooling plate 164 attached to the puck assembly 166. As shown, an o-ring 240 or gasket may be vulcanized to the cooling plate 164 along a perimeter of a top side of the cooling plate 164. Alternatively, the o-ring or gasket may be disposed on the top side of the cooling plate 164 without being vulcanized thereto. Alternatively, no o-ring or gasket may be used at the interface of the cooling plate 164 and the puck assembly 166. Some embodiments are discussed herein with reference to o-rings and gaskets that are vulcanized to at least a portion of the cooling plate 164. However, it should be understood that the o-rings and/or gaskets may alternatively be vulcanized to the lower puck plate. Alternatively, the o-rings and/or gaskets may not be vulcanized to any surface. In one embodiment, the o-ring 240 or gasket is a perfluoropolymer (PFP) o-ring or polyimide o-ring or gasket. Alternatively, other types of high temperature o-rings may be used. In one embodiment, thermally insulating high temperature o-rings or gaskets are used. The o-ring 240 or gasket may be a stepped o-ring or gasket having a first step at a first thickness and a second step at a second thickness. This may facilitate uniform tightening of fasteners by causing the amount of force used to tighten the fasteners to increase dramatically after a set amount of compression of the o-ring 240 or gasket.

Additional o-rings (not shown) or gaskets may also be vulcanized to the top side of the cooling plate around a hole 280 at a center of the cooling plate 164 through which cables are run. Other smaller o-rings or gaskets may also be vulcanized to the cooling plate 164 around other openings, around lift pins, and so forth. For example, a gasket (e.g., a PFP gasket or polyimide gasket) may be vulcanized to the top side of the cooling plate 164. Examples of PFPs usable for the gasket or o-ring 240 are Dupont's™ ECCtreme™, Dupont's KALREZ® and Daikin's® DUPRA™. The o-ring 240 or gasket may provide a vacuum seal between a chamber interior volume and interior volumes within the substrate support assembly 150. The interior volumes within the substrate support assembly 150 may include open spaces within the pedestal 152 for routing conduits and wiring.

In one embodiment, the cooling plate 164 additionally includes numerous features 242 through which fasteners are inserted. If a gasket is used, the gasket may have cutouts at each of the features 242. Fasteners may extend through each of the features 242 and attach to additional portions of the fasteners (or additional fasteners) that are inserted into additional features formed in one or more plates of the puck assembly 166. For example, a bolt may extend through a feature 242 in the cooling plate 164 and be screwed into a nut disposed in a feature of a plate of the puck assembly 166. Each feature 242 in the cooling plate 164 may line up to a similar feature (not shown) in a lower puck plate 232 or other plate of puck assembly 166.

In one embodiment, the puck assembly 166 has a disc-like shape having an annular periphery that may substantially match the shape and size of the substrate 144 positioned thereon. An upper surface of the puck assembly 166 may have an outer ring 216, multiple mesas 206, 210 and channels 208, 212 between the mesas 210. In one embodiment, the puck assembly 166 includes an upper puck plate 230 bonded to the lower puck plate 232 by a metal bond, a ceramic bond, an organic bond, a polymer bond, or other type of bond. In one embodiment, the bond has different thermal conductivity in different directions. For example, the bond may have different thermal conductivity in the x, y and/or z directions. In some embodiments, the bond comprises a ceramic with metal fillers (e.g., having ellipsoid particles). The metal fillers may alter a thermal conductivity of the bond in a targeted direction. The thermal conductivity of the bond may accordingly be tailored in one or more directions or planes so that it has isotropic or anisotropic heat transfer properties. In one embodiment, the upper puck plate 230 may be fabricated by an electrically insulative ceramic material. Suitable examples of the ceramic materials include aluminum nitride (AlN), alumina ($Al_2O_3$), and the like.

In one embodiment, the material used for the lower puck plate 232 may be suitably chosen so that a coefficient of thermal expansion (CTE) for the lower puck plate 232 material substantially matches the CTE of the electrically insulative upper puck plate 230 material in order to minimize CTE mismatch and avoid thermo-mechanical stresses which may damage the puck 166 during thermal cycling. In one embodiment, the lower puck plate 232 is Molybdenum. In one embodiment, the lower puck plate is alumina. In one embodiment, the lower puck plate is AlN or $Al_2O_3$. The lower puck plate may be composed of a same material as the upper puck plate, but may have a different purity level, a different grain size, different amounts of dopants, and so on to provide different material properties for the lower puck plate than the upper puck plate in embodiments.

In one embodiment, an electrically conductive metal matrix composite (MMC) material is used for the lower puck plate 232. The MMC material includes a metal matrix and a reinforcing material which is embedded and dispersed throughout the matrix. The metal matrix may include a single metal or two or more metals or metal alloys. Metals which may be used include but are not limited to aluminum (Al), magnesium (Mg), titanium (Ti), cobalt (Co), cobalt-nickel alloy (CoNi), nickel (Ni), chromium (Cr), gold (Au), silver (Ag) or various combinations thereof. The reinforcing material may be selected to provide the preferred structural strength for the MMC and may also be selected to provide preferred values for other properties of the MMC, such as thermal conductivity and CTE, for example. Examples of reinforcing materials which may be used include silicon (Si), carbon (C), or silicon carbide (SiC), but other materials may also be used.

The MMC material for the lower puck plate 232 is preferably chosen to provide the preferred electrical conductivity and to substantially match the CTE of the upper puck plate 230 material over the operating temperature range for the substrate support assembly 150. In one embodiment, the temperature may range from about 20° Celsius to about 500° Celsius. In one embodiment, matching the CTEs is based on selecting the MMC material so that the MMC material includes at least one material which is also used in the upper puck plate 230 material. In one embodiment, the upper puck plate 230 includes AlN. In one embodiment, the MMC material includes a SiC porous body that is infiltrated with an AlSi alloy.

The constituent materials and composition percentages of the MMC may be selected to provide an engineered material with preferred characteristics. For example, by suitably selecting the MCC material to closely match the CTEs of the lower puck plate 232 and upper puck plate 230, the thermo-mechanical stresses at an interface between the lower puck plate 232 and the upper puck plate 230 are reduced.

The cooling plate 164 attached below the puck 166 may have a disc-like main portion 224 and an annular flange extending outwardly from the main portion 224 and positioned on the pedestal 152. In one embodiment, the cooling plate 164 may be fabricated by a metal, such as aluminum or stainless steel or other suitable materials. Alternatively, the cooling plate 164 may be fabricated by a composite ceramic, such as an aluminum-silicon alloy infiltrated SiC or Molybdenum to match a thermal expansion coefficient of the puck 166. The cooling plate 164 should provide good strength and durability as well as heat transfer properties.

Figure 3:
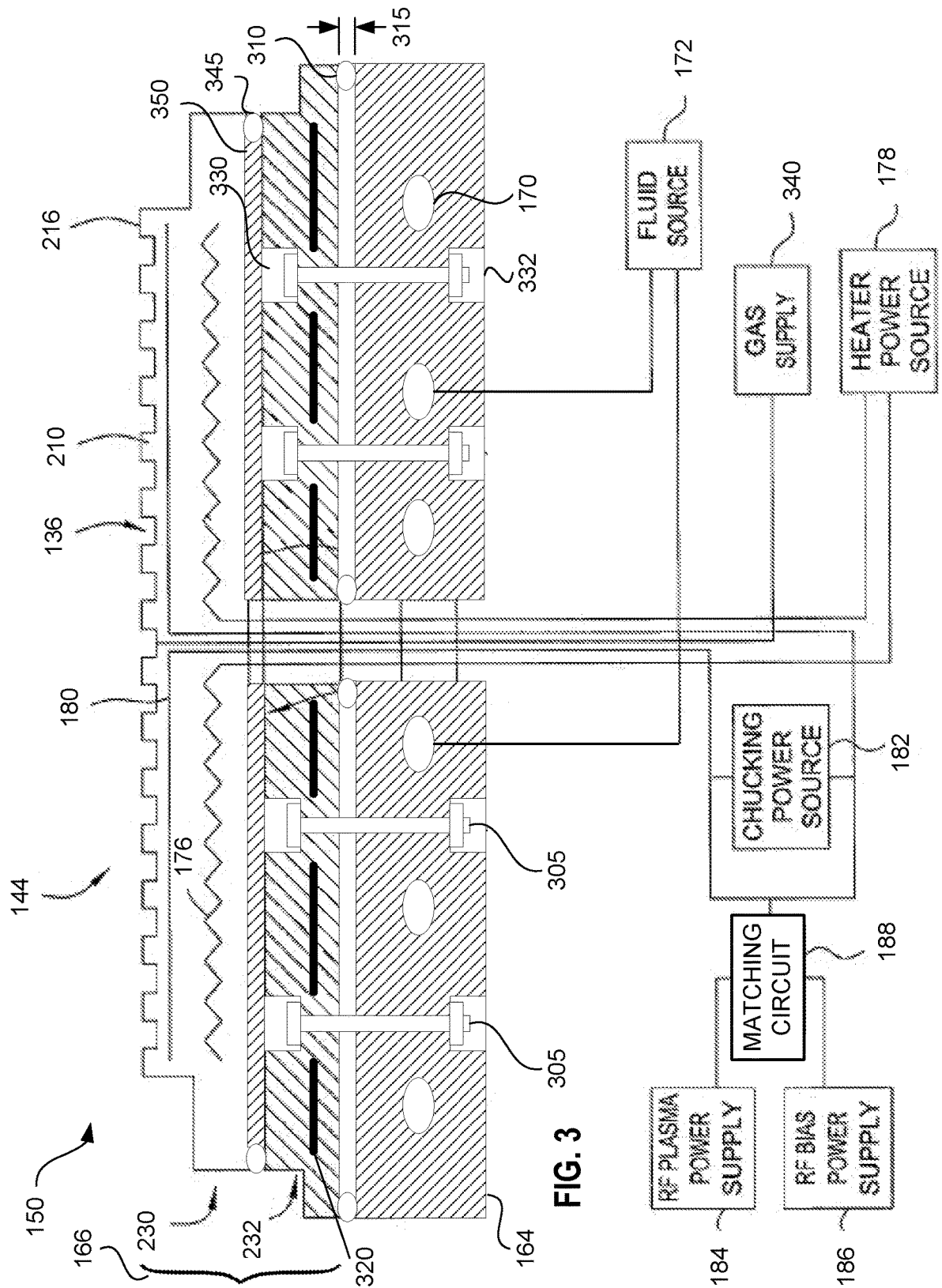
FIG. 3 depicts a sectional side view of one embodiment of a substrate support assembly.

FIG. 3 depicts a sectional side view of one embodiment of a substrate support assembly 150. The substrate support assembly 150 includes a puck assembly 166 made up of an upper puck plate 230 and a lower puck plate 232 that are bonded together by a bond 350, which may be a metal bond, an organic bond, a polymer bond, a ceramic bond, or other type of bond. The substrate support assembly 150 may alternatively have more than two plates, such as three plates, four plates, five plates, and so on. Different techniques may be used to bond the multiple plates. One technique that may be used for bonding is metal bonding. Polymer bonding, diffusion bonding, organic bonding, and so on may also be performed to bond plates together. In some embodiments, all plates are bonded using a same bonding technique. In some embodiments, different bonding techniques are used for different plates. In one embodiment, diffusion bonding is used as a method of metal bonding plates of the substrate support assembly 150 together. In one embodiment, the upper puck plate 230 and the lower puck plate 232 comprise materials which include aluminum (e.g., AlN or $Al_2O_3$).

Bond 350 may be a metal bond 350 that may include an "interlayer" of aluminum foil or other metal foil which is placed in a bonding region between the upper puck plate 230 and the lower puck plate 232. Pressure and heat may be applied to form a diffusion bond between the aluminum foil and the upper puck plate 230 and between the aluminum foil and lower puck plate 232. In another embodiment, the diffusion bond may be formed using other interlayer materials which are selected based upon the materials used for upper puck plate 230 and lower puck plate 232. In another embodiment, the upper puck plate 230 may be directly bonded to the lower puck plate 232 using direct diffusion bonding in which no interlayer is used to form the bond. An organic bond, ceramic bond, polymer bond, or other type of bond may also be formed to bond the plates together.

In one embodiment, an o-ring 345 is used to protect bond 350. A plasma resistant and high temperature o-ring 345 may be made of a perfluoropolymer (PFP) or polyimide in embodiments. The o-ring 345 may be a PFP with inorganic additives such as SiC in an embodiment. The o-ring may be replaceable. When the o-ring 345 degrades it may be removed and a new o-ring may be stretched over the upper puck plate 230 and placed at a perimeter of the puck 166 at an interface between the upper puck plate 230 and the lower puck plate 232. The o-ring 345 may protect the metal bond 350 from erosion by plasma. In some embodiments, no o-ring is used to protect the bond 350.

The upper puck plate 230 includes mesas 210, channels 212 and optionally an outer ring 216. In one embodiment, the upper puck plate 230 includes functional elements such as clamping electrodes 180 and/or one or more heating elements 176. Alternatively, the clamping electrodes 180 and/or heating elements 176 may be disposed in different plates (e.g., heating elements and/or clamping electrodes may be disposed in lower puck plate 232). In some embodiments, lower puck plate 232 may include one or more functional elements 320 (e.g., heating elements, clamping electrodes, and/or RF electrodes). The clamping electrodes 180 may be coupled to a chucking power source 182, and/or to an RF plasma power supply 184 and/or an RF bias power supply 186 via a matching circuit 188. The upper puck plate 230, lower puck plate 232 and/or other plates may additionally include gas delivery holes (not shown) through which a gas supply 340 pumps a backside gas such as He. Additionally, the upper puck plate 230, lower puck plate 232 and/or other plates may additionally include one or more cooling holes (not shown) for a cooling fluid to flow therethrough.

The upper puck plate 230 and/or lower puck plate 232 may have a thickness of about 1-25 mm or more. In one embodiment, the upper puck plate 230 has a thickness of about 3 mm. The clamping electrodes 180 may be located about 0.25 mm from an upper surface of the upper puck plate 230, and the heating elements 176 may be located about 1 mm under the clamping electrodes 180. The heating elements 176 may be screen printed heating elements having a thickness of about 10-200 microns in some embodiments. Alternatively, the heating elements may be resistive coils that use about 1-3 mm of thickness of the upper puck plate 230 in some embodiments. In such an embodiment, the upper puck plate 230 may have a minimum thickness of about 5 mm. In one embodiment, the lower puck plate 232 has a thickness of about 1-25 mm. In some embodiments, the upper and/or lower puck plates have thicknesses ranging from 1 mm to 10 mm, 2 mm to 8 mm, or other thicknesses. In embodiments, different puck plates may have the same or different thicknesses, which may range from 1-25 mm, for example. In embodiments, interface layers between puck plates may have a thickness of about 25 microns to about 1 mm (e.g., 1-14 mil).

The heating elements 176 are electrically connected to a heater power source 178 for heating the upper puck plate 230. The upper puck plate 230 may include electrically insulative materials such as AlN. The lower puck plate 232 and upper puck plate 232 (and/or one or more other plates) may be made of the same materials and/or different materials. In one embodiment, the lower puck plate 232 is made of materials which are different from the materials used for the upper puck plate 230. In one embodiment, the lower puck plate 232 is composed of a metal matrix composite material. In one aspect, the metal matrix composite material includes aluminum and silicon. In one embodiment, the metal matrix composite is a SiC porous body infiltrated with an AlSi alloy.

The lower puck plate 232 is coupled to and in thermal communication with a cooling plate 164 having one or more conduits 170 (also referred to herein as cooling channels) in fluid communication with fluid source 172. In one embodiment, the cooling plate 164 is coupled to the puck assembly 166 by multiple fasteners 305. The fasteners 305 may be threaded fasteners such as nut and bolt pairs. As shown, in some embodiments the lower puck plate 232 (or anther plate of puck assembly 166) includes multiple features 330 for accommodating the fasteners 305. The cooling plate 164 likewise may include multiple features 332 for accommodating the fasteners 305. In one embodiment, the features are bolt holes with counter bores. As shown, the features 330 are through features that extend through the lower puck plate 232 and/or one or more other puck plates of puck assembly 166. Alternatively, the features 330 may not be through features. In one embodiment, the features 330 are slots that accommodate a t-shaped bolt head or rectangular nut that may be inserted into the slot and then rotated 90 degrees. In one embodiment, the fasteners include washers, grafoil, aluminum foil, or other load spreading materials to distribute forces from a head of the fastener evenly over a feature. In some embodiments, fasteners are not used to connect puck assembly 166 to cooling plate 164. In some embodiments, a bond is used to secure puck assembly 166 to cooling plate 164.

In one embodiment (as shown), an o-ring 310 is vulcanized to (or otherwise disposed on) the cooling plate at a perimeter of the cooling plate 164. Alternatively, the o-ring 310 may be vulcanized or attached to the bottom side of the cooling plate 232. Alternatively, a gasket may be used. In some embodiments, fasteners 305 may be tightened to compress the o-ring 310 or gasket. The fasteners 305 may all be tightened with approximately the same force to cause a separation 315 between the puck assembly 166 and the cooling plate 164 to be approximately the same (uniform) throughout the interface between the puck assembly 166 and the cooling plate 164. This may ensure that the heat transfer properties between the cooling plate 164 and the puck assembly 166 are uniform. In one embodiment, the separation 315 is about 2-10 mils or more. The separation may be 2-10 mils, for example, if the o-ring 310 is used without a grafoil layer. If a grafoil layer is used along with the o-ring 310, then the separation may be about 10-40 mils. Larger separation may decrease heat transfer, and cause the interface between the puck assembly 166 and the cooling plate 164 to act as a thermal choke. In one embodiment, a conductive gas may be flowed into the separation 315 to improve heat transfer between the puck assembly 166 and the cooling plate 164. In some embodiments, an o-ring or gasket is not used between puck assembly 166 and cooling plate 164. In some embodiments, a separation 315 between puck assembly 166 and cooling plate 164 minimizes the contact area between the puck assembly 166 and the cooling plate 164.

In some embodiments, one or more plates of puck assembly 166 are not bonded together. In such embodiments, fasteners may be used to couple the multiple plates of puck assembly 166 together. For example, two adjacent plates may each include features for accommodating a threaded insert and/or ahead of a threaded fastener. The threaded fastener may then extend between the two plates and be tightened against the threaded insert in the adjacent plate. In some embodiments, multiple plates include holes that permit a threaded shaft to extend through the plates to a threaded insert in another plate of puck assembly 166. For example, a top plate of puck assembly 166 may include threaded inserts, and a threaded fastener (e.g., a bolt) may extend from the cooling plate through lower puck plate 232 and/or one or more other plates, and be threaded to the threaded insert in the upper puck plate 230 to tighten the entire puck assembly 166 against each other and against the cooling plate 164. Alternatively, some plates may be bonded, while others may be attached by threaded fasteners.

In one embodiment (not shown), a grafoil layer or other flexible graphite layer is disposed between the puck assembly 166 and the cooling plate 164. The flexible graphite may have a thickness of about 10-40 mil. The fasteners 305 may be tightened to compress the flexible graphite layer as well as the o-ring 310 or gasket. The flexible graphite may be thermally conductive, and may improve a heat transfer between the puck assembly 166 and the cooling plate 164.

In one embodiment (not shown), the cooling plate 164 includes a base portion. In one embodiment, o-ring 310 may be vulcanized to the base portion. In one embodiment, the cooling plate 164 includes a spring loaded inner heat sink connected to the base portion by one or more springs. The springs apply a force to press the inner heat sink against the puck 166. A surface of the heat sink may have a predetermined roughness and/or surface features (e.g., mesas) that control heat transfer properties between the puck 166 and the heat sink. Additionally, the material of the heat sink may affect the heat transfer properties. For example, an aluminum heat sink will transfer heat better than a stainless steel heat sink. In one embodiment, the heat sink includes a grafoil layer on an upper surface of the heat sink.

Figure 4:
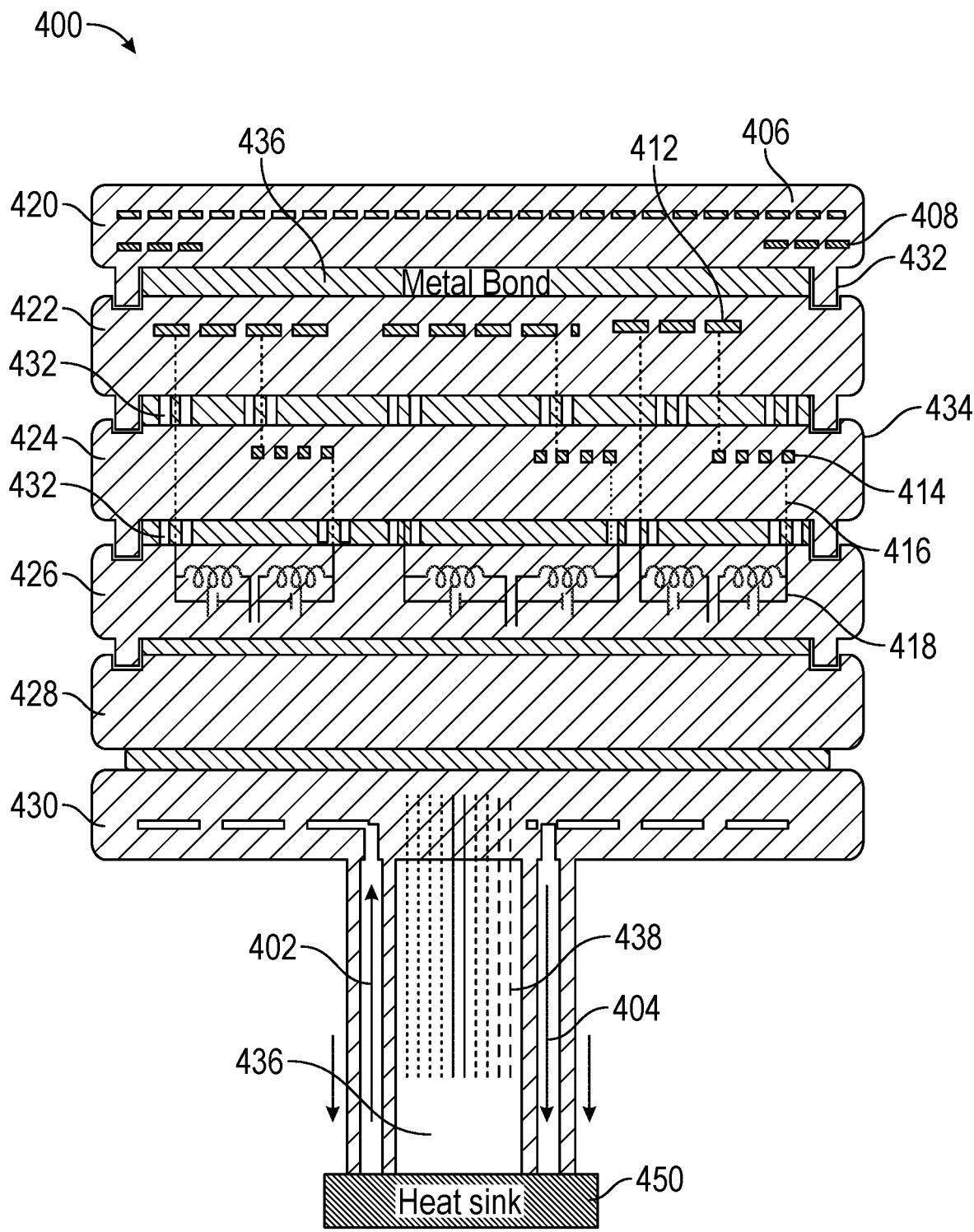
FIG. 4 depicts a sectional side view of another embodiment of a puck plate assembly in a substrate support assembly.

FIG. 4 depicts a cross-sectional view of a puck plate assembly in a substrate support assembly 400, according to one embodiment. The substrate support assembly 400 can include one or more puck plates 420-430. Some or all of the puck plates may include one or more functional elements. Examples of functional elements include a clamp electrode, a zone heater, a pixelated heater, a radio frequency (RF) electrode, a gas channel, a gas pocket, and so on.

In one embodiment, a top puck plate 420 may include one or more clamp electrodes 406, which may create an electrostatic force that holds a substrate in place. The clamp electrodes 406 may extend over a portion of the area of the top puck plate 420 or an entire area of the top puck plate 420. The top puck plate 420 can additionally or alternatively include one or more RF electrodes 408, which can be placed along a circumference of the top puck plate 420 in an embodiment. The RF electrodes 408 can be used to generate plasma for material processing in processes such as RF plasma etching and RF sputtering. The RF electrodes 408 may extend over a portion of the area of the top puck plate 420 or an entire area of top puck plate 420.

An intermediate puck plate 422 may include one or more heating electrodes 412. The heating electrodes 412 may be in the form of a zone heater and/or a pixelated heater. A surface of substrate support assembly 400 may be divided into multiple zones, such as an inner zone, an intermediate zone, and an outer zone. Each zone may include a separate heating electrode of set of heating electrodes, and the temperature of each zone may be separately controlled. A pixelated heater may include many small sub-zones that may be within the main zones of the substrate support assembly 400. The pixelated heater may include different heating elements for each of the sub-zones, which may be used to fine-tune a temperature distribution within the zones. The pixelated heater may include, for example, 16, 32, 64, 128, 216, or other numbers of separately controllable heating elements or electrodes. The heating electrodes 412 may provide controlled heating to the substrate. The heating electrodes 412 may include a resistive element or a set of resistive elements that can generate heat when an electric current is passed through them. By applying a current to the heating electrodes 412, the temperature of the substrate can be increased and maintained at a specific level. The heating electrodes 412 can also help manage thermal stresses during temperature changes. By gradually heating or cooling the substrate, thermal stress differentials can be minimized, reducing the likelihood of substrate damage. In some embodiments, one plate may include a smaller number of main heater electrodes, and another plate may include a larger number of auxiliary or pixelated heater electrodes. In some embodiments, the main heater electrodes may be configured to handle greater power than the auxiliary heater electrodes.

Puck plates 420, 422 can be bonded using a bonding layer including one or more melting point depressing layers (MDL), such as Ni, Ti, C, or Si, which may be applied to a bottom surface of a top puck plate 420 and/or a top surface of a bottom puck plate 422. The bonding layer may also include a metal interlayer 436, which may be placed between upper and lower MDL layers. The metal interlayer 436 may include a flexible graphite layer, an organic elastomer, Al, In, Ni, Ti, or an alloy including Ni—Ti or Mo—Mg, or Cu—Ag or Al alloy.

Top puck plate 420 may also be bonded to the intermediate puck plate 422 via a mechanical clamp, for example. For example, a bottom surface of the top puck plate 420 may include a male mating component 432, which may fit into a female mating component 434 formed on a top surface of the intermediate puck plate 422. The male mating component 432 may include mesas or protrusion, while the female mating component 434 may include grooves or channels. The mesas and channels may be formed along a circumference of the puck plates such that when they are joined together, the male mating component 432 snugly fits into the female mating components 434. Although the top puck plate 420 is illustrated to have the male mating component 432 on a bottom surface the intermediate puck plate 422 is illustrated to have the female mating component 434, the mating components can be interchanged such that the top puck plate 420 has a female mating component 434 and the intermediate puck plate 422 has a male mating component 432 to achieve the same result. Examples of materials that may be used in forming the puck plates include niobium, aluminum oxide, aluminum nitride, single crystal alumina, or sapphire. One or more puck plates may be formed using a hot press, a hot isostatic press, a green sheet, a gel cast, or a sol gel process.

An intermediate puck plate 424 may include additional heating electrodes 414. The heating electrodes 414 may be in the form of a zone heater and/or a pixelated heater. The heating electrodes 414 may extend over a portion of the area of the puck plate 424 or an entire area of puck plate 424. The heating electrodes 414 may be connected in series or in parallel to heating electrodes 412 in puck plate 422 in some embodiments. The heating electrodes 412 and heating electrodes 414 may be vertically offset and/or offset in an X-Y plane from one another by a designed amount. This enables one or more puck plates to act as a diffuser with increased heat distribution.

A further intermediate puck plate 426 may include one or more RF filters 418 to ensure that interference and noise in an electrical signal applied to heating elements are minimized, reducing the impact on the substrate. The RF filters 418 may include one or more inductors and one or more capacitors, which may be connected in parallel. The RF filters 418 may be connected in series or in parallel to the heating electrodes 412 and/or heating electrodes 414 in an embodiment. The RF filters 418 may be configured to control the flow of radio frequency power in the electrostatic chuck and prevent it from interfering with the surrounding devices. The RF filters 418 may be connected to an RF power source that generates an AC voltage at a specific frequency that is applied to the electrodes within the substrate support assembly. When the RF power is applied to the electrodes, harmonics and noise can be produced as a result of various factors such as impedance mismatch, parasitic capacitance, and non-linear behavior of the chuck and its surrounding components. The RF filter 418 may include various components such as capacitors, inductors, and resistors. These components can be strategically placed within the circuit to attenuate or suppress unwanted harmonics and noise. Capacitors may be used to create a low impedance path for the target RF frequency, allowing the RF power to flow through them. However, they act as a high impedance for high frequency noise and block its passage. Inductors may be employed to impede the flow of high-frequency signals while allowing the target RF frequency to pass through. They store energy in their magnetic fields, which may help to isolate the harmonics and noise. Resistors may be used to dampen or dissipate unwanted signals by converting them into heat. Resistors help reduce the amplitude of the harmonics and noise that may be present. The filtered RF signal that passes through the RF filters 418 may be applied to the clamp electrodes 406 and/or heating electrodes 412, 414 of the substrate support assembly 400 in some embodiments, ensuring that interference and noise are minimized.

In embodiments, the RF filters are functional elements that are integrated into one or more plates of the puck assembly. Traditionally, an RF filter is an RC filter that is not a part of a heater of chuck, and that is connected to the heater or chuck. Accordingly, traditionally RF filtering is performed outside of the heater or chuck. By integrating the RF filter into the puck assembly, a form factor size savings is achieved.

Clamp electrodes 406, RF electrodes 408, heating electrodes 412, 414, and RF filters 418 may be connected to one or more power source (not shown) via wires 416, which may be routed through or include vias 432 formed in each of the puck plates 422, 424, 426. In some embodiments, one or more puck plates may include a wire distribution layer. A wire distribution layer may have terminals that the wires (e.g., wires 416) from other plates and/or layers connect to. The wire distribution plates may additionally connect to or provide routing to one or more power sources. In some embodiments, a wire distribution layer may be below the other electrical functional elements (e.g., heating elements, RF electrodes, RF filters, etc.). In some embodiments, a wire distribution layer may be above one or more other electrical functional elements. This may enable vias to extend upwards from electrical functional elements to the wire distribution layer, which may then connect to further vias that extend below the wire distribution layer (and below the other electrical functional elements). By having a wire distribution layer above electrical functional elements, routing and design choices for a layout of the electrical functional elements may be increased, allowing for a greater density of electrodes in one or more plates for example.

Substrate support assembly 400 may further include a cooling plate 430, which can be mounted on a shaft 402. The shaft 402 may have a hollow body 436 such that the wires 438 that extend out from the substrate support assembly 400 can be routed to one or more power source. The cooling plate 430 may include a cooling loop 404, which may circulate a cooling fluid such as a coolant or a refrigerant, or water, or air, or a combination thereof. The cooling loop 404 may be connected to a heat sink 450 to receive the heat from the cooling plate 430 and pump out cold fluid back to the cooling plate 430. Additionally, or alternatively, one or more puck plates may include cooling channels and may act as a cooling plate. Puck plates 420-430 can be bonded to an adjoining puck plate using a bonding layer, such as a metal bond layer, an organic bond layer, a ceramic bond layer, and so on. In one embodiment, one or more bond layers includes one or more melting point depressing layers (MDL), such as Ni, Ti, C, or Si, which may be applied to a bottom surface of a puck plate and/or a top surface of an adjoining puck plate. The bonding layer may also include an interface layer, which may be placed between the MDL layers. The interface layer may include a flexible graphite layer, an organic elastomer, Al, In, Ni, Ti, or an alloy including Ni—Ti or Mo—Mg, or Cu—Ag or Al alloy.

An intermediate puck plate may also be bonded to another intermediate puck plate via a mechanical clamp. For example, a bottom surface of the one puck plate may include a male mating component 432, which may fit into a female mating component 434 formed on a top surface of another intermediate puck plate. The male mating component 432 may include mesas or protrusion, while the female mating component 434 may include grooves or channels. The mesas and channels may be formed along a circumference of the puck plates such that when they are joined together, the male mating component 432 snugly fits into the female mating components 434. Additionally, or alternatively, threaded fasteners may be used to secure puck plates together as described above.

Examples of materials that may be used in forming the puck plates include niobium, aluminum oxide, aluminum nitride, single crystal alumina, or sapphire. One or more puck plates may be formed using a hot press, a hot isostatic press, a green sheet, a gel cast, or a sol gel process.

In some embodiments, one or more puck plates 420-430 include blocking features that have a greater diameter than a remainder of the puck plates. The blocking feature may shield underlying puck plates from exposure to plasma in embodiments.

Note that a plate assembly including five plates 420-428 is shown merely for the purposes of illustration. Greater or fewer plates may be used than shown. The functional elements in one or more of the plates may be the same as or different from the functional elements shown in the example.

Figure 5A:
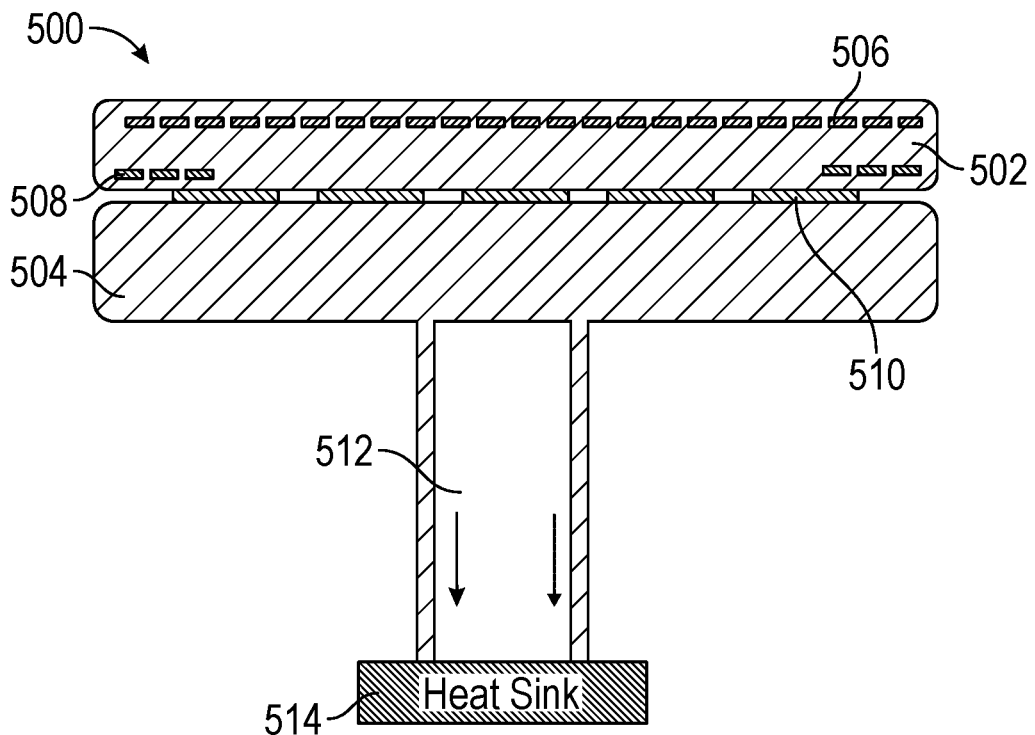
FIGS. 5A and 5B depict sectional side views of various embodiments of a puck plate assembly in a substrate support assembly.

FIG. 5A depicts a sectional side view of an embodiment of a puck plate assembly 500. In some embodiments, a top puck plate 502 may include one or more clamp electrodes 506 and one or more RF electrodes 508 (similar to puck plate 420 in FIG. 4). However, puck plate 502 may be bonded to another puck plate 504 using a metal bond layer that also acts as a heating electrode 510. The heating electrode 510 may include a bonding material and a coating material applied to the bonding material. The heating electrode may include a pattern of heating elements in a plane between the top puck plate 502 and bottom puck plate 504. For example, a patterned bond layer may function as a heating electrode 510. The coating material may have a coefficient of thermal expansion (CTE) that is different from (e.g., greater than) a CTE of puck plates 502, 504, and different from (e.g., lesser than) a CTE of the bonding material, ensuring a proper joint, preventing material failure due to thermal stress, and maintaining dimensional stability of the structure. Materials like metals generally have higher CTE values, meaning they expand more with temperature changes. On the other hand, materials like ceramics or certain polymers have lower CTE values, indicating less expansion or contraction with temperature. The substrate support assembly 500 may also include a hollow shaft 512 (similar to shaft 402 in FIG. 4), which may be used to transfer heat from the puck plate assembly to a heat sink 514.

Figure 5B:
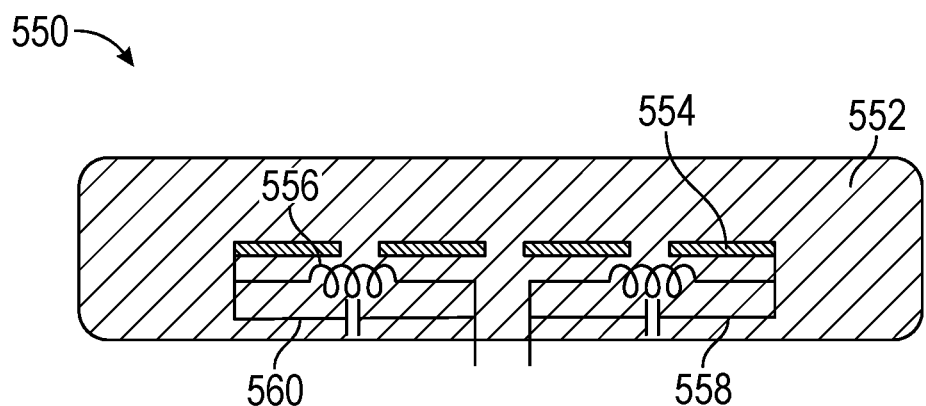

FIG. 5B depicts a sectional side view of an embodiment of a puck plate in an electrostatic chuck assembly 550. In some embodiments, a single puck plate may include multiple functional elements. For example, puck plate 552 may include a heating element 554, which may be connected in parallel to one or more RF filters 558. The RF filters 558 may include one or more inductors 556, which may be connected in parallel to one or more capacitors 560.

Figure 6:
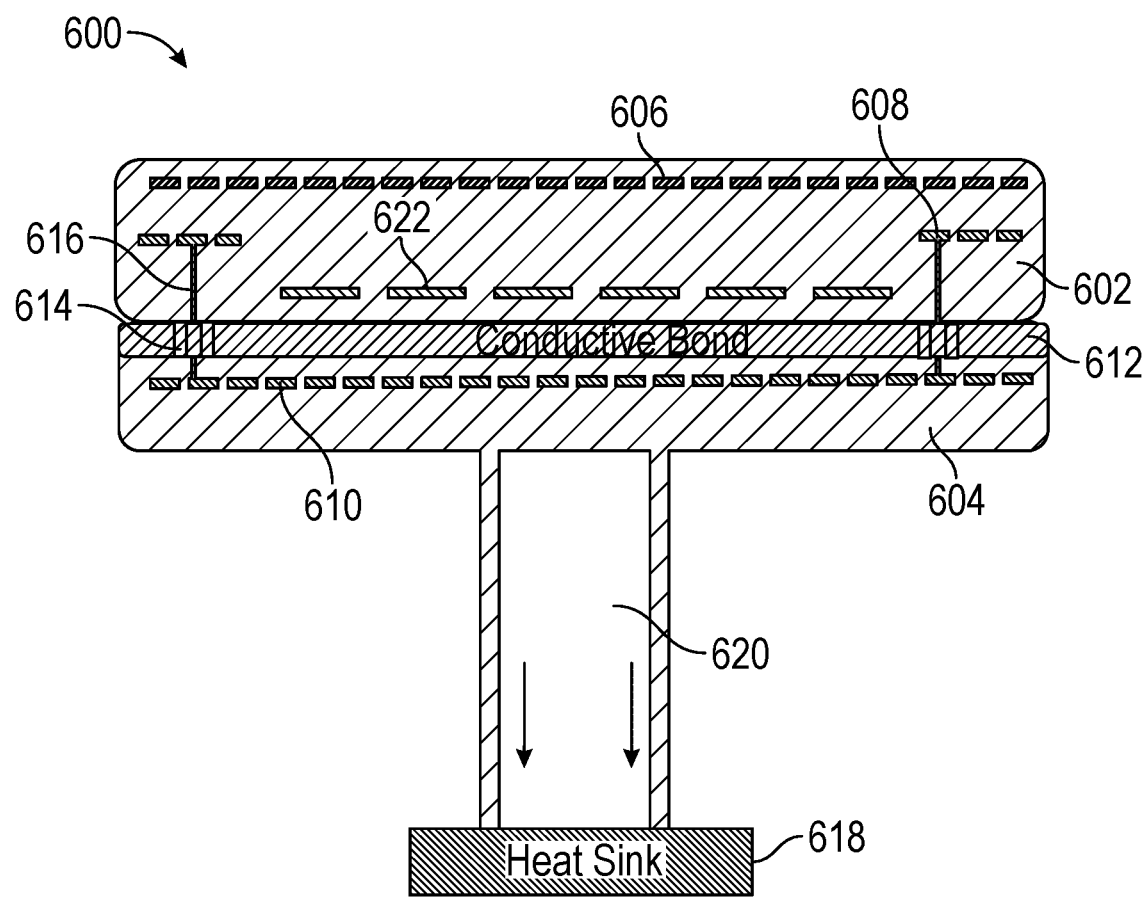
FIG. 6 depicts a sectional side view of another embodiment of a puck plate assembly in a substrate support assembly.

FIG. 6 depicts a sectional side view of another embodiment of a puck plate assembly 600. In some embodiments, top puck plate 602 may include one or more clamp electrodes 606 and one or more RF electrodes 608 (similar to puck plate 420 in FIG. 4). However, puck plate 602 may be bonded to another puck plate 604 using conductive bond layer 612. The conductive bond layer 612 may include a bonding material and a coating material applied to the bonding material. The coating material may have a coefficient of thermal expansion (CTE) that is different from (e.g., greater than) a CTE of puck plates 602, 604, and different from (e.g., lesser than) a CTE of the bonding material, ensuring a proper joint, preventing material failure due to thermal stress, and maintaining dimensional stability of the structure.

Puck plate 602 may further include one or more heating electrodes 622 (similar to heating electrodes 412, 414 in FIG. 4). Puck plate 604 may include one or more RF filters 610 that may be coupled in series with RF electrodes 608 such that the heating electrode 622 is surrounded by the RF electrodes 608 for forming a floating shield around the heating electrodes 622 to ensure that interference and noise are minimized, reducing the impact on the substrate. RF electrodes 608 may be coupled to the RF filters 610 via terminals 616, which can be routed between the puck plates using vias 614 formed in the conductive bond layer 612. The electrostatic chuck assembly 600 may also include a hollow shaft 612 (similar to shaft 402 in FIG. 4), which may be used to transfer heat from the puck plate assembly to a heat sink 618. In some embodiments, a resonant frequency of the one or more RF filters can be different from (e.g., greater than) a frequency of the one or more heating elements. The one or more RF filters can be co-located with the one or more heating elements with the same puck plate. Alternatively, or in addition, the one or more RF filters can be located in a separate puck plate.

In embodiments, multiple heating electrodes may be arranged in series and/or in parallel to tune a thermal behavior of the heating electrodes. The multiple heating electrodes may be positioned at the same pitch, at different pitches, in a same plate, and/or in different plates. The resistances of heating elements (e.g., coils, screen printed patterns of electrodes, etc.) can be based on coil diameter and/or wire/trace thickness. Different heating electrodes may have different sized cross sections (e.g., different thicknesses and/or wire diameters). Additionally, or alternatively, a single electrode may have a varying cross section size (e.g., varying thicknesses and/or wire diameters) to adjust a resistance and thus a heating performance of the heating elements.

In some instances, heating elements in different planes may be fully or partially spatially aligned, or may not be spatially aligned. Heating elements may be arranged in parallel to decrease a net resistance. Generally speaking, the electrical resistance of a heating electrode is increased by increasing a length of the heating electrode, but it is challenging (if even possible) to reduce the resistance of the heating electrode. For example, reducing a length of the heating electrode may reduce the resistance for the heating electrode, but may also reduce the heating area of the heating electrode. Accordingly, usually decreasing the resistance of a heating electrode is a problem. By putting heating electrodes in parallel, it decreases the net resistance. $P=V^2/R$, where P is power, V is voltage, and R is resistance. Accordingly, increasing the denominator (R) reduces a net available power to heat. However, by reducing R based on connecting multiple heating electrodes in parallel the total power, and thus ability to heat, can be increased.

A substrate support assembly may include full zone heaters and/or multi-zone heaters. A four zone heater and/or multi-zone heater may provide radial control in the temperature profiles of a substrate support assembly. Pixelated heaters may additionally or alternatively be used to address azimuth thermal non-uniformity.

In embodiments, to increase resistance heating elements in different planes are connected in series. The placement of one or more layers of heating elements arranged in series may be designed to provide a pixelated heater in embodiments. In some embodiments, multiple connecting paths are provided between different heating elements and/or a ground and/or power source. Switches may be included in one or more of the paths, and may be used to dynamically control whether two or more heating electrodes are connected in parallel, are connected in series, or are not connected. A controller may be connected to the switches, and may change whether different heating electrodes are connected in series, in parallel, or not at all based on one or more temperature readings. This can provide the functionality of a pixelated heater in embodiments.

In an example, multiple heating elements may be connected in series to form a large heat source. In one embodiment, the resistance of a puck assembly may be increased in a central region or zone of the substrate support assembly by having series resistances (of multiple heating electrodes) in this region. The series connections may be permanently configured, or may be dynamically controllable in embodiments.

Historically, different power sources are used for a main heater, an auxiliary heater and/or a pixelated heater. In embodiments, heating electrodes (e.g., of a main heater, auxiliary heater, four zone heater, pixelated heater, etc.) may be connected in series and/or in parallel to a same power source.

Historically, heating elements are formed in a same plane in a single green sheet (e.g., in a single monolithic ceramic puck). In embodiments, designed resistances are increased or decreased by arranging heating elements in parallel and/or in series on adjacent plates. By intentionally offsetting heating elements at different vertical pitches (e.g., different distances from a supported substrate), a more uniform thermal uniformity may be provided.

Traditionally, wire routing is in the downward direction towards the cooling plate. However, in embodiments top side routing may additionally or alternatively be used, meaning the wire can go up or the via can go up to a wire layer, and then come down.

FIGS. 7A-7E depict sectional side views of various embodiments of a puck plate assembly in an electrostatic chuck assembly or a substrate support assembly showing different arrangements of heating electrodes in different planes and connected in series or in parallel. Puck plates 702, 704 may include one or more heating electrodes 708, 710, respectively. The heating electrodes 708, 710 may be in the form of a zone heater and/or a pixelated heater, for example. The heating electrodes 708, 710 may provide controlled heating to the substrate. The heating electrodes 708, 710 may include a resistive material or a set of resistive elements that can generate heat when an electric current is passed through them. By applying a current to the heating electrodes 708, 710, the temperature of the substrate can be increased and maintained at a specific level. The heating electrodes 708, 710 can also help manage thermal stresses during temperature changes. By gradually heating or cooling the substrate, thermal stress differentials can be minimized, reducing the likelihood of substrate damage.

Figure 7A:
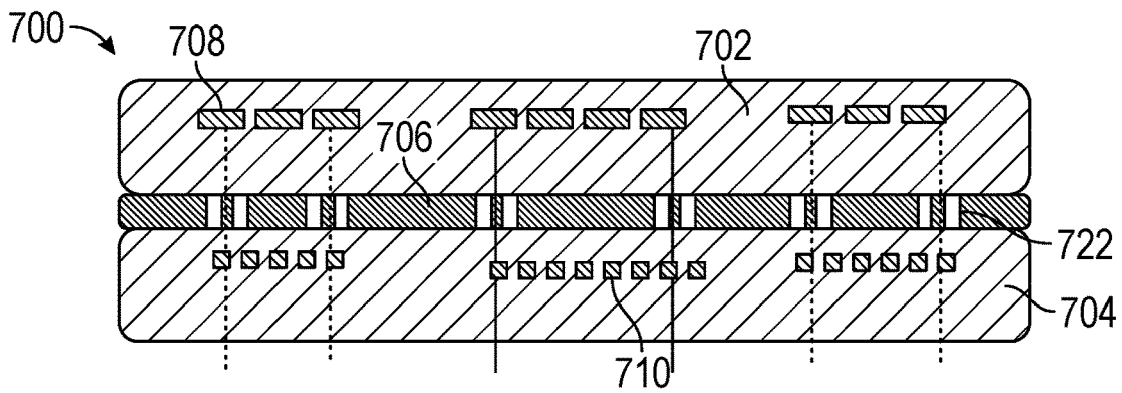
FIGS. 7A-7E depict sectional side views of various embodiments of a puck plate assembly.

In the assembly 700 illustrated in FIG. 7A, heating electrodes 708 in puck plate 702 may be coupled in parallel with heating electrodes 710 in puck plate 704. Puck plates 702, 704 can be bonded using a bonding layer 706. The bonding layer may include one or more melting point depressing layers (MDL), such as Ni, Ti, C, or Si, which may be applied to a bottom surface of a top puck plate 702 and/or a top surface of a bottom puck plate 704. In another embodiment, the bonding layer comprises a combination of a sputtering and a foil of metal or metal alloy. A metal layer (e.g., pure metal Al or multiple metal Ni—Al) can be sputtered either to a bottom surface of the top puck plate 702 and/or a top surface of the bottom puck plate 704. A thin foil of metal may include either a high purity metal or alloy. The bonding layer 706 may include one or more vias 722 to enable terminals from heating electrodes 708, 710 to pass between puck plates 702, 704 and terminate either on a substrate support surface and/or a bottom surface of the assembly 700.

Figure 7B:
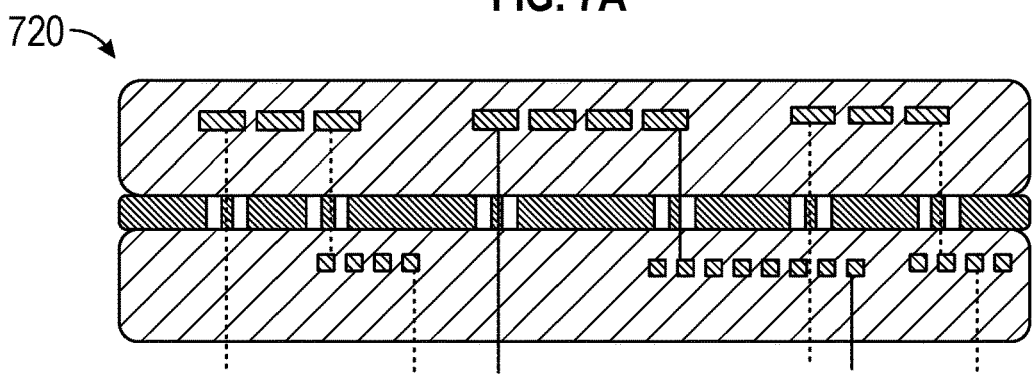

In the assembly 720 illustrated in FIG. 7B, heating electrodes 708 in puck plate 702 may be coupled in series with heating electrodes 710 in puck plate 704. The bonding layer may also include a metal interlayer, which may be placed between the MDL layers. The metal interlayer may include a flexible graphite layer, an organic elastomer, Al, In, Ni, Ti, or an alloy including Ni—Ti or Mo—Mg, or Cu—Ag or Al alloy. Examples of materials that may be used in forming the puck plates include niobium, aluminum oxide, aluminum nitride, single crystal alumina, or sapphire. One or more puck plates may be formed using a hot press, a hot isostatic press, a green sheet, a gel cast, or a sol gel process.

Figure 7C:
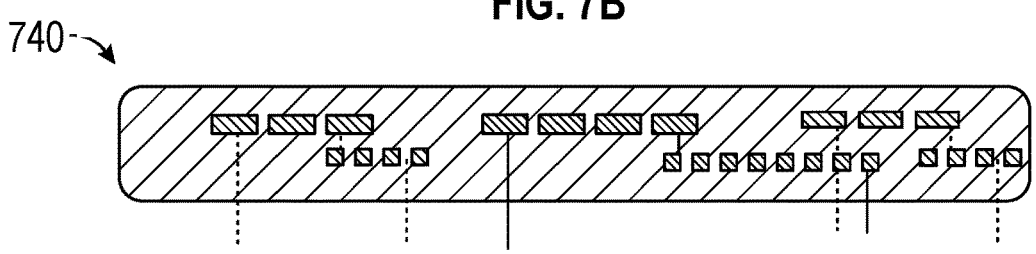
Figure 7D:
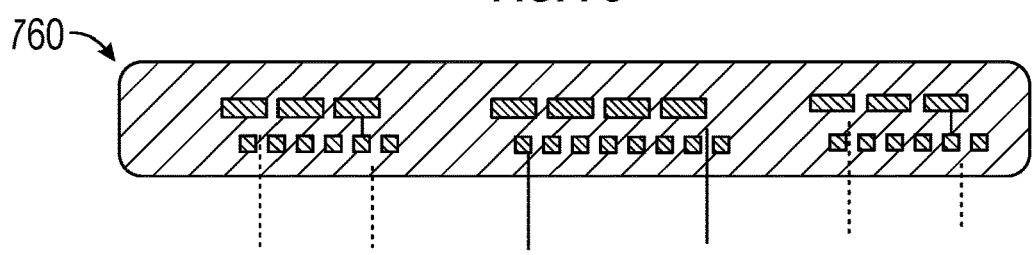

In the puck plate 740 illustrated in FIG. 7C, heating electrodes 708 are coupled in series with heating electrodes 710 within the same puck plate 740. Similarly, in the puck plate 760 illustrated in FIG. 7D, heating electrodes 708 are coupled in parallel with heating electrodes 710 within the same puck plate 740.

Figure 7E:
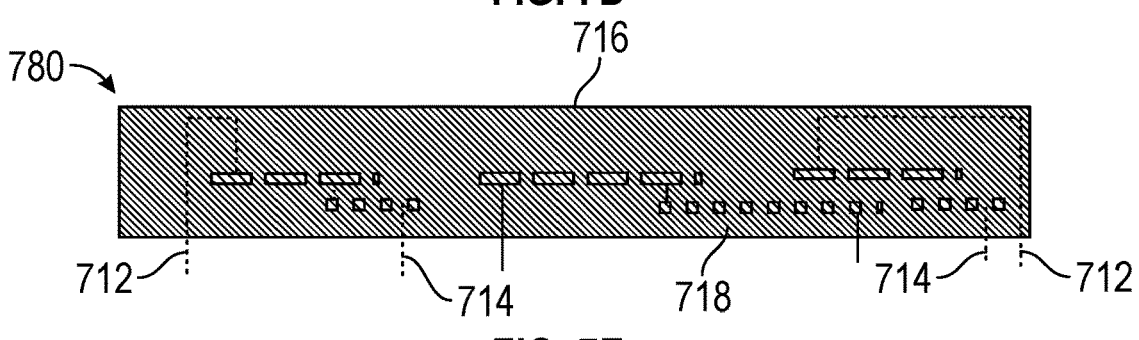

FIG. 7E illustrates another embodiment where a single puck plate 780 includes two or more heating electrodes 708, 710 that may be connected in series. The heating electrodes 708, 710 may be in the form of a zone heater and/or a pixelated heater. The heating electrodes 708, 710 may extend over a portion of the area of the puck plate 780 or an entire area of puck plate 780. In some embodiments, terminal wires 712, 714 of the heating electrodes 708, 710 can be routed upwards towards the wafer side or the substrate support surface 716 instead of a bottom surface 718 of the substrate support assembly. In another implementation, terminal wire 712 may be routed towards a wafer side and terminal wire 714 may be routed towards a bottom surface of the substrate support assembly.

In the embodiments illustrated in FIGS. 7A-7E, the substrate support assembly may include heaters in multiple planes for one or more zones. In one implementation, one zone may have heating electrodes spread over two or more puck plates, and another zone may have heating electrodes in the same puck plate. In some embodiments, the heating electrodes in the different planes can be of different temperature coefficients of resistance (TCR). For example, one puck plate of the substrate support assembly can have a positive TCR and another puck plate of the substrate support assembly can have a negative TCR. In some implementations, the heating electrodes can be offset from each other, and in some implementations the heating electrodes may be parallel to each other.

In one implementation, the substrate support assembly may have a body including one or more puck plates. The substrate support assembly may include a heating electrode (e.g., electrode 708) in a first heating zone of the body and another heating electrode in the same zone (e.g., electrode 710). As illustrated in FIGS. 7A and 7B, the heating electrodes may be connected in series or in parallel. A series connection between the heating electrodes increases a net resistance for the combination of the heating electrodes, and a parallel connection between the heating electrodes reduces a net resistance for the combination of the heating electrodes. In one example, one heating electrode may be in a first plane of the substrate support assembly (e.g., puck plate 702), and the second heating electrode may be in a second plane of the substrate support assembly (e.g., puck plate 704) that this vertically offset from the first plane. As illustrated in FIG. 7E, one or more terminal wires 712, 714 may be disposed above the heating electrodes in the body of the substrate support assembly. One or more vias 722 may be formed in the body, which may connect at least one of the heating electrodes 708, 710 to one or more terminal wires 712, 714. In one implementation, one or more additional vias (not shown) may be used to connect the one or more terminal wires to at least one of a power source connection or a ground connection (not shown) below the heating electrodes 708, 710. In one example, a first heating electrode (e.g., electrode 708) may include a main heating electrode, and a second heating electrode (e.g., electrode 710) may include an auxiliary heating electrode. In one implementation, the main heating electrode and the auxiliary heating electrode may be a connected to a same power source, or different power sources. In one example, the heating electrodes 708, 710 may be installed in a central heating zone of the substrate support assembly. In one example, the heating electrodes 708, 710 may be installed in a peripheral heating zone of the substrate support assembly. The heating electrodes 708, 710 may be connected in parallel, as illustrated in FIG. 7A, or they may be connected in series, as illustrated in FIG. 7B. In another example, the substrate support assembly may include heating electrodes in an alternate heating zone (e.g., peripheral zone) of the body of the substrate support assembly, which may be placed in the same plane or different planes. The heating electrodes in the alternate heating zone may be connected in in parallel, as shown in FIG. 7A or in series, as shown in FIG. 7B.

Figure 8:
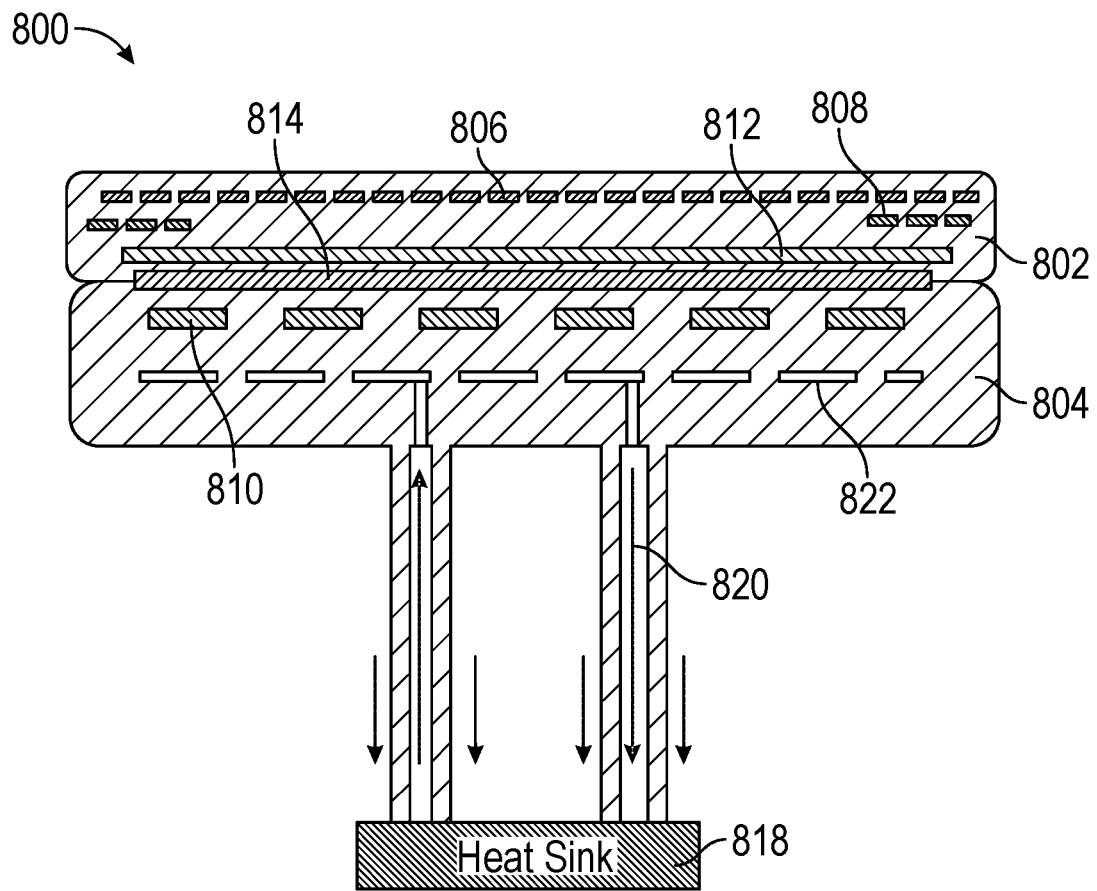
FIG. 8 depicts a sectional side view of another embodiment of a puck plate assembly in a substrate support assembly.

FIG. 8 depicts a sectional side view of another embodiment of a puck plate assembly in substrate support assembly

800. The substrate support assembly 800 can include puck plates 802, 804. A top puck plate 802 may include one or more clamp electrodes 806, which may create an electrostatic force that holds the substrate in place. The clamp electrodes 806 may extend over a portion of the area of the top puck plate 802 or an entire area of the top puck plate 802. The top puck plate 802 can also include one or more RF electrodes 808, which can be placed along a circumference of the top puck plate 802. The RF electrodes 808 may extend over a portion of the area of the top puck plate 802 or an entire area of top puck plate 802. A bottom puck plate 804 may include one or more heating electrodes 810. The heating electrodes 810 may be in the form of a zone heater and/or a pixelated heater. The heating electrodes 810 may provide providing controlled heating to the substrate. The heating electrodes 810 may include a resistive material or a set of resistive elements that can generate heat when an electric current is passed through them.

Puck plate 802 may include one or more clamp electrodes 812, also known as the clamping electrode or clamping plate, which may be responsible for creating an electrostatic force that firmly holds the puck plate 804 in place. Puck plate 804 may include a chucking electrode 814 for creating an e-chuck between clamp electrode 812 and chucking electrode 814. When an electric potential is applied between the clamp electrode 812 and the chucking electrode 814, an electric field is established between them. This electric field induces a charge on the bottom surface of the top puck plate 802. The induced charge creates an electrostatic force that attracts and holds the puck plate 802 against the chucking surface of the puck plate 804. The clamp electrode 812 ensures a uniform and reliable clamping force across the entire surface of the puck plate 802. Similarly, the chucking electrode 814 ensures a uniform and reliable clamping force across the entire surface of the puck plate 804.

In some embodiments, puck plate 802 acts as a carrier for a substrate, and may be moved with a substrate. For example, a robot arm may pick and place the plate 802 while the plate 802 supports a substrate.

In some embodiments, clamp electrode 812 and/or chucking electrode 814 are configured to provide a maximal residual charge so that plate 802 remains chucked to plate 804 for a long period of time even after no power is applied to the chucking electrode 814 and/or clamp electrode 812. In some embodiments, plate 802 and/or plate 804 includes alignment features that enable plate 802 to align with plate 804 at a target alignment.

Puck plate 804 can be mounted on a hollow shaft having a hollow body such that the wires that extend out from the electrostatic chuck assembly 800 can be routed to a power source. Puck plate 804 may include a cooling loop 820, which may circulate a cooling fluid such as a coolant or a refrigerant, or water, or air, or a combination thereof. The cooling loop 820 may be connected to a heat sink 818 to receive the heat from the puck plate 804 and pump out cold fluid back to the puck plate 804.

Figure 9:
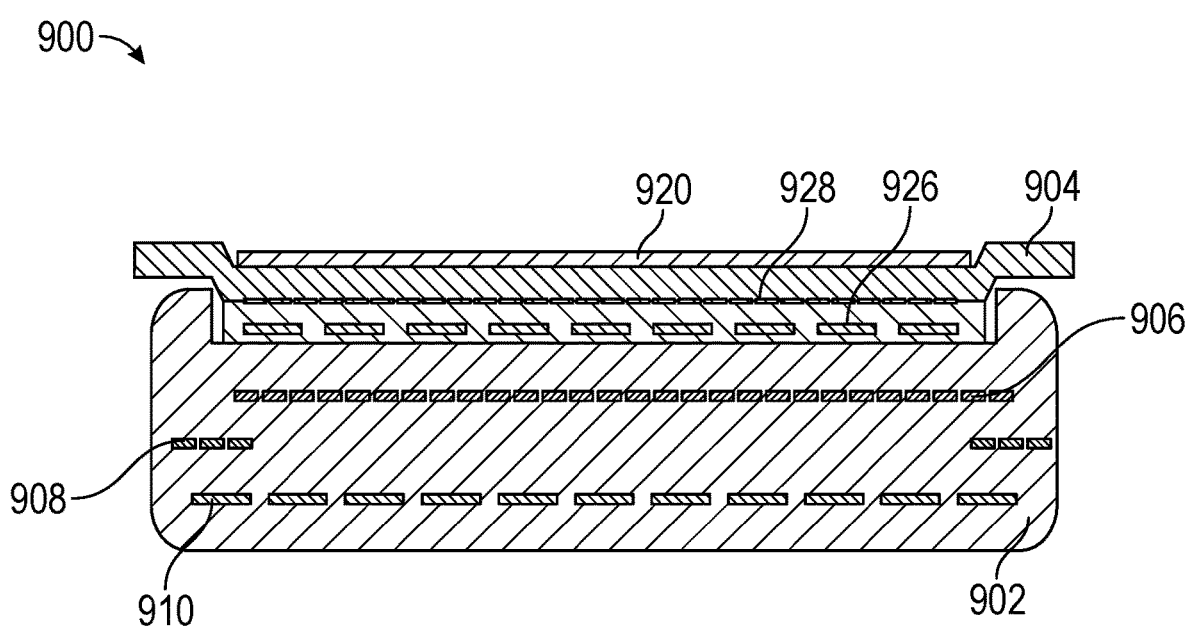
FIG. 9 depicts a sectional side view of another embodiment of a puck plate assembly.

FIG. 9 depicts a sectional side view of another embodiment of a puck plate assembly in an electrostatic chuck assembly 900. In some embodiments, the electrostatic chuck assembly 900 may include a portable carrier 904 that removably fits on a top puck plate 902. The portable carrier 904 may be configured to receive a semiconductor wafer 920. In some embodiments, the portable carrier 904 may be made of a polymeric material including but not limited to paramids, The portable carrier 904 may also include a halogen resistant material including at least one of yttrium aluminum garnet (YAG) or sapphire or high purity small grain alumina, or high purity hot isostatic or hot press alumina. The portable carrier 904 further may include one or more functional elements 926, 928. A top puck plate 902 may include one or more clamp electrodes 906, which may create an electrostatic force that holds the substrate in place. The clamp electrodes 906 may extend over a portion of the area of the top puck plate 902 or an entire area of the top puck plate 902. The top puck plate 902 can also include one or more RF electrodes 908, which can be placed along a circumference of the top puck plate 902. The RF electrodes 908 may extend over a portion of the area of the top puck plate 902 or an entire area of top puck plate 902. Puck plate 902 may also include one or more heating electrodes 910. The heating electrodes 910 may be in the form of a zone heater and/or a pixelated heater. The heating electrodes 910 may provide providing controlled heating to the substrate. The heating electrodes 910 may include a resistive material or a set of resistive elements that can generate heat when an electric current is passed through them.

The functional elements 926, 928 may include at least one of a clamp electrode, a zone heater, a pixelated heater, a radio frequency (RF) electrode, a gas channel, or a gas pocket. In some embodiments, puck plate 902 may include a first electrode pattern, and the portable carrier 904 may include a second electrode pattern. The first electrode pattern and the second electrode pattern can be operatively coupled to a power source for creating an electromagnetic force between the puck plate 902 and portable carrier 904.

Figure 10A:
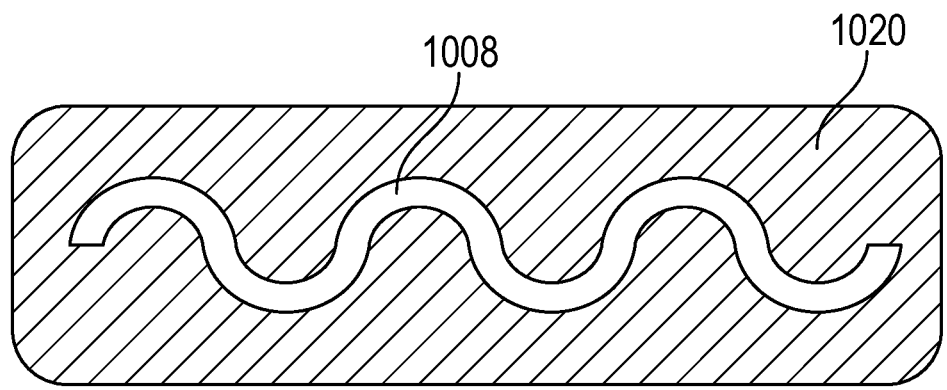
FIGS. 10A and 10B depict sectional side views of various embodiments of functional elements of a puck plate used in a puck plate assembly.

FIG. 10A depicts sectional side views of an embodiments of a puck plate 1020 in an electrostatic chuck assembly 1000. Puck plate 1020 may include one or more RF electrodes 1008. The RF electrodes 1008 can be in the same plane or they can be spread along the thickness direction of the ceramic plate. The RF electrodes 1008 can be connected to RF match and power source to ensure that interference and noise are minimized, reducing the impact on the substrate. The RF power source that generates an AC voltage at a specific frequency that is applied to the electrodes within the electrostatic chuck. When the RF power is applied to the electrodes, harmonics and noise can be produced as a result of various factors such as impedance mismatch, parasitic capacitance, and non-linear behavior of the chuck and its surrounding components. The RF filter may include various components such as capacitors, inductors, and resistors. These components can be strategically placed within the circuit to attenuate or suppress unwanted harmonics and noise. The filtered RF signal that passes through the RF electrodes 1008 may impact the plasma density in the processing chamber.

Figure 10B:
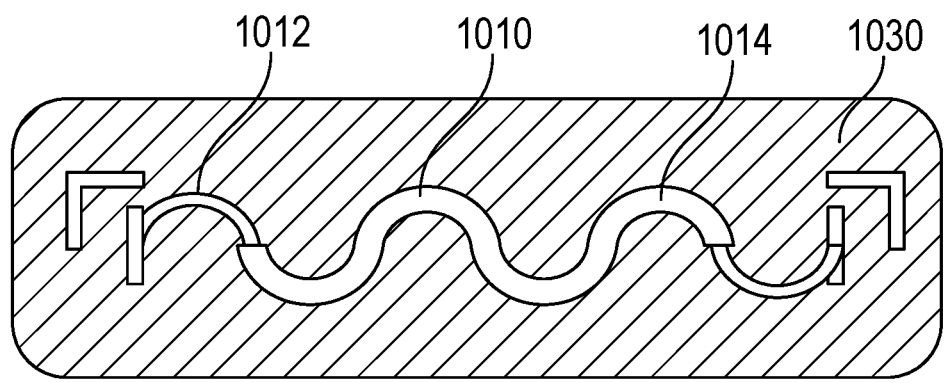

FIG. 10B depicts sectional side views of an embodiments of a puck plate 1030 in an electrostatic chuck assembly 1050. Puck plate 1030 may include one or more RF electrode meshes 1010. The RF electrode meshes 1010 may have a first thickness 1012 at a first location and a second thickness 1014 at a second location along a length of the RF electrode mesh. The RF electrode mesh 1010 can be fully or partially surrounded by a secondary electrode (not shown). The secondary electrode may lie parallel to the main RF electrode mesh 1010. A potential may or may not be applied to the surrounding secondary electrode. The secondary electrode serves the purpose of tuning the electromagnetic fields around the substrate support and hence altering the etch or deposition properties.

Traditional substrate supports (e.g., heaters and electrostatic chucks) are monolithic ceramic bodies. Accordingly, if the substrate support fails to satisfy one or more criteria associated with qualification, the substrate support is scrapped and there is no way to recover it. However, in embodiments since substrate support assemblies are comprised of multiple plates, if a substrate support assembly fails a qualification test, one or more plates may be modified by planing the plate(s) and/or a plate or plates that caused the assembly to fail the qualification tests may be replaced with another plate. In some embodiments, a top plate is planed or polished in one or more regions to modify a heat profile and/or temperature distribution of the substrate support assembly. In some embodiments, one or more other plates may be planed or polished to modify a heat profile and/or temperature distribution of the substrate support assembly.

Figure 11:
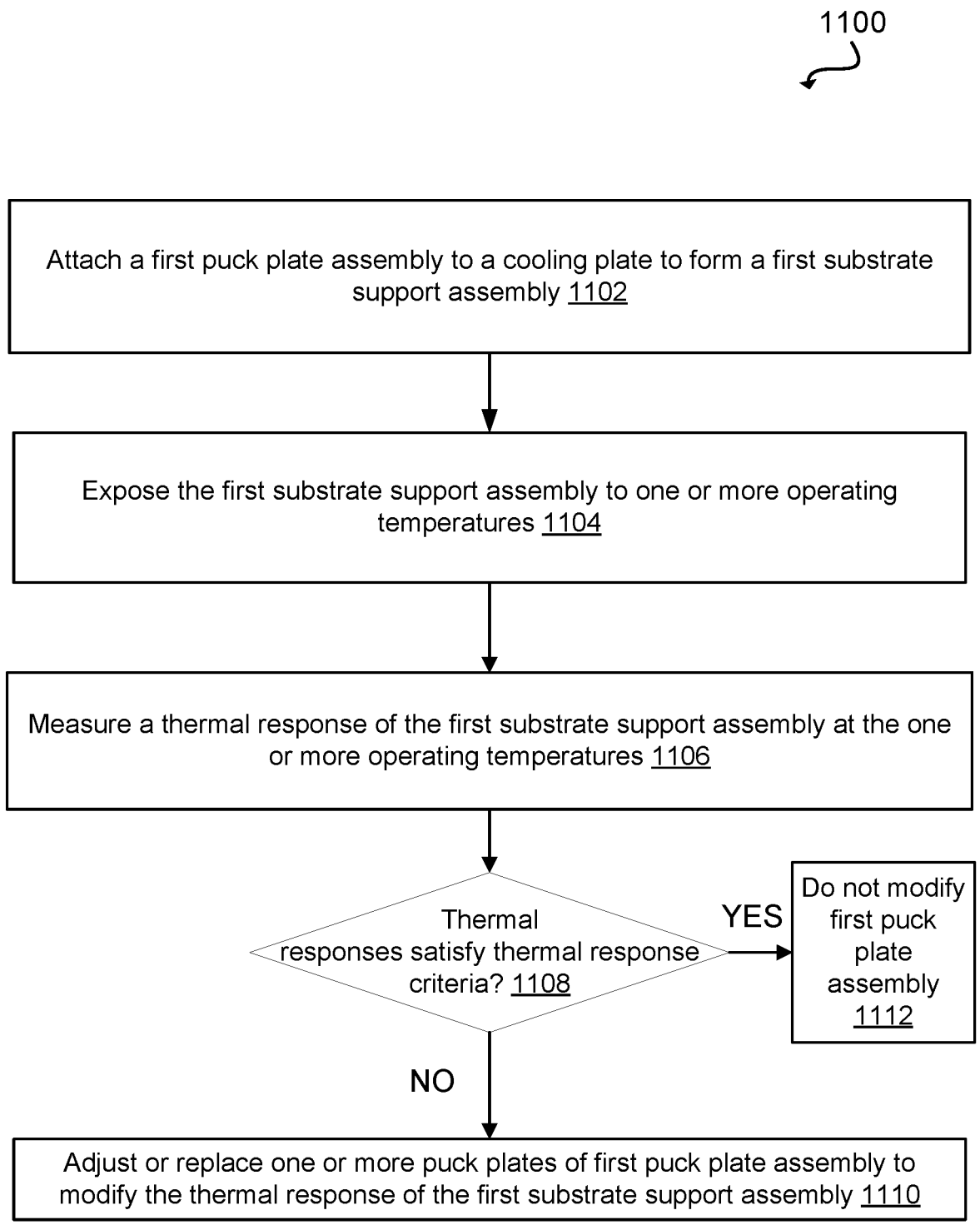
FIG. 11 illustrates one embodiment of a process for testing thermal response of a puck plate assembly and adjusting the puck plate assembly.

FIG. 11 illustrates one embodiment of a process 1100 for evaluating thermal response of an electrostatic chuck assembly and modifying one or more plates forming the electrostatic assembly so as to improve its performance. At block 1102, a puck plate assembly is attached to a cooling plate to form a substrate support assembly (e.g., an electrostatic chuck assembly). At block 1104, the substrate support assembly is exposed to a range of operating temperatures between 0° C. and 200° C., for example. The operating temperatures can be varied by a fixed amount, for example, 10° C. at a time, or a variable amount. At block 1106, a thermal response of the substrate support assembly is recorded at each of the different operating temperatures. In one example, the temperature on a top surface of a top puck plate may be read at one or more locations. In one example, the temperature may be read at one or more locations along the circumference of the top puck plate and/or other puck plates of the substrate support assembly. At block 1108, it may be determined that the thermal response (e.g., temperature read at one or more locations) for at least one operating temperature is outside of a predetermined threshold response (e.g., above or below a threshold temperature range), which can be based on established benchmarks, for example. When the thermal response for at least one operating temperature is outside of a predetermined threshold response, one or more puck plates that form the puck plate assembly may be removed at block 1110. Alternatively, if the thermal response for at least one operating temperature is within predetermined threshold response, then there is no need to modify the puck plate assembly at block 1112.

The method at block 1110 may further include detaching the puck plate assembly from the cooling plate, and adjusting or replacing one or more puck plates in the puck plate assembly. In one example, adjusting a puck plate may involve polishing one or more regions of the puck plate. In one example, adjusting a puck plate may involve reducing a thickness of the puck plate in one or more regions. The method may further include re-attaching the one or more puck plates back to the other puck plates after polishing, to re-assemble the puck plate assembly, or change the order of the puck plates to form a new puck plate assembly. In one example, one or more new puck plates may be introduced to form an entirely new puck plate assembly. Additionally, the one or more puck plates forming the puck plate assembly can be removed, and the thermal response may be re-evaluated separately. In one example, the thermal response of each of the puck plates may be assessed individually to determine an overall thermal response of the puck plate assembly. The method may also include forming a new puck plate assembly, and attaching the new puck plate assembly to the cooling plate to form a renewed substrate support assembly. The renewed substrate support assembly may be exposed to different operating temperatures as described above, and a thermal response of the renewed substrate support assembly at the different operating temperatures can be measured. One advantage of performing an iterative process as described above is that the thermal response can be customized based on the end application, and the puck plate assembly can be modified to suit that specific end application.

Figure 12:
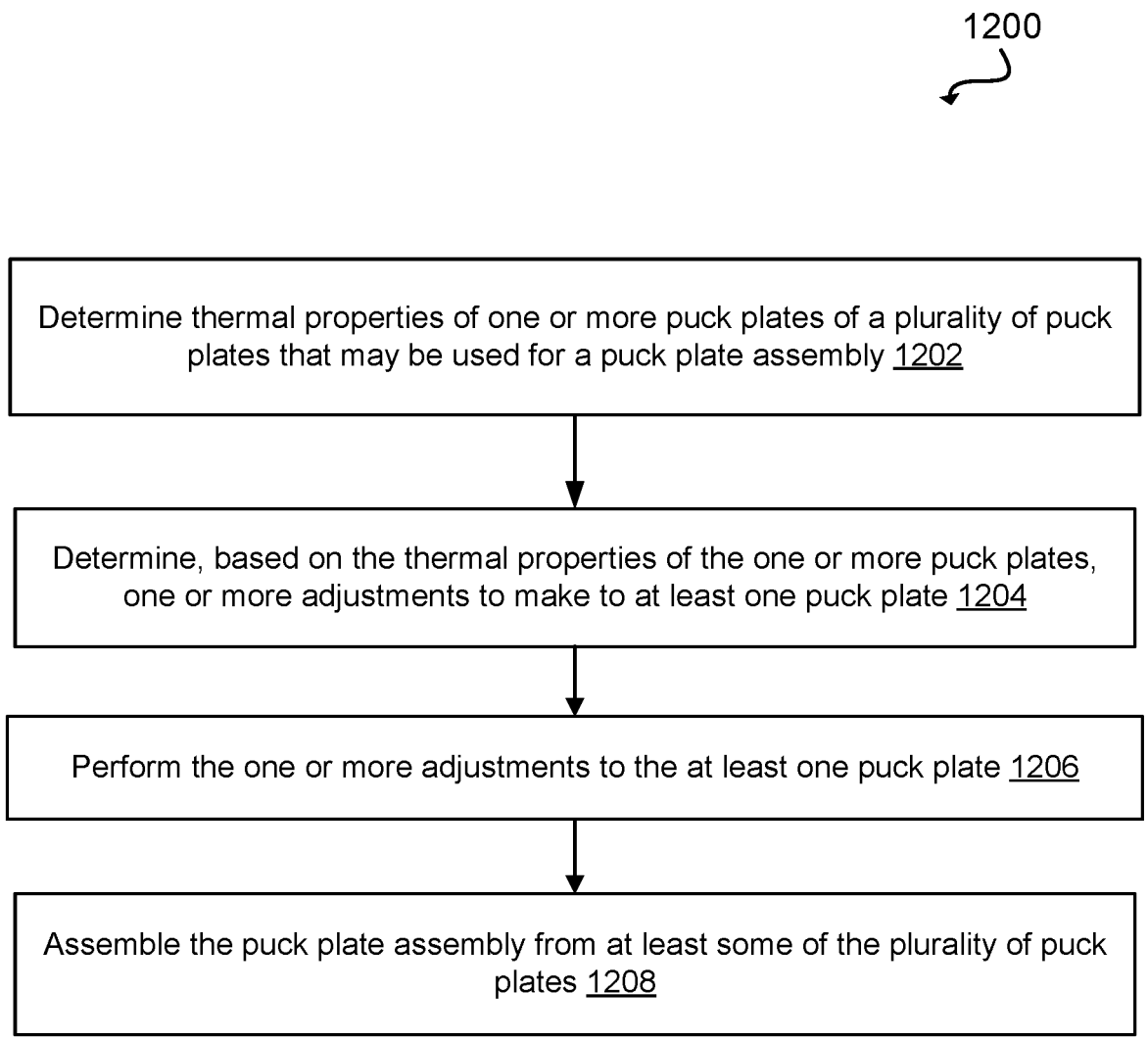
FIG. 12 illustrates one embodiment of a process for testing thermal response of a puck plate assembly and adjusting the puck plate assembly.

FIG. 12 illustrates one embodiment of a process 1200 for evaluating thermal response of an electrostatic chuck assembly and modifying one or more plates forming the electrostatic assembly so as to improve its performance. At block 1202, method 1200 includes determining thermal properties of one or more puck plates that form a puck plate assembly. In one example, determining thermal properties may include a temperature range in which a plate may operate normally. In another example, determining thermal properties may include reading a temperature at one or more locations on a top and/or bottom surface of a puck plate. The temperature reading may be recorded at a single operating temperature, or at multiple operating temperatures. In one example, determining the thermal properties may involve attaching a puck plate to a cold plate and exposing the puck plate to one or more operating temperatures, and measuring a thermal response of the puck plate at the operating temperatures. In one example, determining the thermal properties may involve modeling the thermal properties of one or more puck plates. For example, a computer program (e.g., a simulation program) may be used simulate the performance of one or more puck plates. At block 1204, based on the thermal properties of the puck plates, the method 1200 may include determining one or more adjustments to one or more puck plates. At block 1206, the adjustments may be performed on the one or more puck plates to improve its performance. For example, at block 1206 it may be determined a certain area in a puck plate is not receiving sufficient cooling from the cooling plate. In response, a thickness of the puck plate may be reduced in one or more locations. In another example, it may be determined a certain area in a puck plate is receiving too much cooling from the cooling plate. In response, a thickness of the puck plate may be increased in one or more locations so as to improve its performance. Other examples may include changing the order of the puck plates in a puck plate assembly in order to improve the performance of the substrate support assembly. At block 1208, the modified puck plates, either in the same order or a different order, can be assembled to form a new puck plate assembly. In another example, the modified puck plates can be combined with one or more new plates, which may properties that may be different from the modified puck plates.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within +10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner. In one embodiment, multiple metal bonding operations are performed in a single operation.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A substrate support assembly, comprising:
   a first puck plate comprising one or more first functional elements;
   a second puck plate comprising one or more second functional elements; and
   at least one of an interface layer at least partially bonding the first puck plate to the second puck plate or one or more mechanical fasteners that fasten the first puck plate to the second puck plate, and wherein a bottom surface of the first puck plate comprises a first one of a male mating component or a female mating component and a top surface of the second puck plate comprises a second one of the male mating component or the female mating component.

2. The substrate support assembly of claim 1, wherein the one or more first functional elements and the one or more second functional elements comprise at least one of a clamp electrode, a zone heater, a pixelated heater, a radio frequency (RF) electrode, a gas channel, or a gas pocket.

3. The substrate support assembly of claim 1, wherein the interface layer comprises at least one of flexible graphite, an organic elastomer, Al, In, Ni, Ti, or an alloy comprising Ni—Ti or Mo—Mg or Cu—Ag or Al alloy.

4. The substrate support assembly of claim 1, wherein the second puck plate comprises one or more heating elements operatively coupled to one or more RF filters, wherein at least one of:
   a) a resonant frequency of the one or RF filters is different from a frequency of the one or more heating elements;
   b) the one or more RF filters are co-located with the one or more heating elements in the second puck plate; or
   c) the one or more RF filters are located in a third puck plate different from the second puck plate.

5. The substrate support assembly of claim 1, further comprising:
   a third puck plate comprising electrodes to connect to at least one of the one or more first functional elements or the one or more second functional elements to a power source.

6. The substrate support assembly of claim 5, wherein at least one of the first puck plate, the second puck plate, or the third puck plate comprise one or more vias that provide electrical connection between the electrodes of the third puck plate and at least one of the one or more first functional elements of the first puck plate or the one or more second functional elements of the second puck plate.

7. The substrate support assembly of claim 1, wherein the interface layer comprises a bonding material and a coating material applied to the bonding material, wherein the coating material has a coefficient of thermal expansion (CTE) that is different from a CTE of the first puck plate and the second puck plate, and that is different from a CTE of the bonding material.

8. The substrate support assembly of claim 1, wherein the interface layer comprises one or more heating elements.

9. The substrate support assembly of claim 1, wherein the one or more first functional elements comprise a first set of heating elements, wherein the one or more second functional elements comprise a second set of heating elements, and wherein the first set of heating elements and the second set of heating elements are connected in series or in parallel.

10. The substrate support assembly of claim 1, wherein the one or more second functional elements comprise a first set of heating elements and a second set of heating elements, and wherein the first set of heating elements and the second set of heating elements are connected in series or in parallel.

11. The substrate support assembly of claim 1, wherein the first puck plate and the second puck plate each comprise at least one of niobium, aluminum oxide, aluminum nitride, single crystal alumina, sapphire, or nitrides, oxides, oxynitrides of a metal or a semiconductor.

12. The substrate support assembly of claim 1, further comprising:
   a detachable third puck plate that removably attaches to the first puck plate, the detachable third puck plate comprising one or more electrodes to electrostatically secure a substrate, wherein the detachable third puck plate is to be electrostatically secured to the first puck plate.

13. The substrate support assembly of claim 12, wherein the detachable third puck plate is a portable carrier that comprises a halogen resistant material comprising at least one of yttrium aluminum garnet (YAG) or sapphire or high purity hot isostatic or hot press alumina.

14. The substrate support assembly of claim 1, wherein the one or more second functional elements comprise one or more heating elements operatively coupled to one or more radio frequency (RF) filters, wherein the one or more RF filters comprise an RF mesh having a first thickness at a first location and a second thickness at a second location.

15. The substrate support assembly of claim 1, wherein the first puck plate and the second puck plate comprise at least one of a) a same material with same purities, b) different materials with same grain sizes, c) the same material with different purities, d) the same material with different grain sizes, or e) different materials with different grain sizes.

* * * * *